US007119350B2

(12) United States Patent
Hashimoto et al.

(10) Patent No.: US 7,119,350 B2
(45) Date of Patent: Oct. 10, 2006

(54) SPATIAL INFORMATION DETECTING DEVICE USING INTENSITY-MODULATED LIGHT AND A BEAT SIGNAL

(75) Inventors: Yusuke Hashimoto, Neyagawa (JP); Yuji Takada, Kyoto (JP); Fumikazu Kurihara, Nara (JP)

(73) Assignee: Matsushita Electric Works, Ltd., Osaka (JP)

( * ) Notice: Subject to any disclaimer, the term of this patent is extended or adjusted under 35 U.S.C. 154(b) by 204 days.

(21) Appl. No.: 10/507,516

(22) PCT Filed: Apr. 7, 2003

(86) PCT No.: PCT/JP03/04400

§ 371 (c)(1),
(2), (4) Date: Sep. 14, 2004

(87) PCT Pub. No.: WO03/085413

PCT Pub. Date: Oct. 16, 2003

(65) Prior Publication Data

US 2005/0145773 A1  Jul. 7, 2005

(30) Foreign Application Priority Data

Apr. 8, 2002  (JP) ............... 2002-105746
Feb. 27, 2003  (JP) ............... 2003-051926

(51) Int. Cl.
 *G01N 21/86*  (2006.01)
(52) U.S. Cl. ............... 250/559.38; 250/208.1
(58) Field of Classification Search ........... 250/559.38, 250/208.1, 206.1
See application file for complete search history.

(56) References Cited

U.S. PATENT DOCUMENTS 5,754,280 A    5/1998 Kato et al.

(Continued)

FOREIGN PATENT DOCUMENTS

AU    715284 B1    3/1998

(Continued)

OTHER PUBLICATIONS

International Search Report of PCT/JP03/04400 mailed on Oct. 15, 2003.

(Continued)

*Primary Examiner*—Que T. Le
(74) *Attorney, Agent, or Firm*—Rader, Fishman & Grauer PLLC

(57) ABSTRACT

A spatial information detecting device using an intensity-modulated light is provided. This device comprises a photoelectric converter for receiving a light from a space into which a light intensity-modulated at a predetermined emission frequency is being irradiated, and generating an electrical output corresponding to an intensity of received light; a local oscillator circuit for outputting a local oscillator signal having a local oscillator frequency different from the emission frequency; a sensitivity controller for mixing the local oscillator signal with the electrical output to frequency convert the electrical output into a beat signal having a lower frequency than the emission frequency; an integrator for performing integration of said beat signal at a predetermined timing; and an analyzer for detecting information concerning the space according to an output of the integrator. According to this device, it is possible to accurately detect the spatial information without using a switching element having high-speed response at the light receiving side.

19 Claims, 27 Drawing Sheets

U.S. PATENT DOCUMENTS

| | | | |
|---|---|---|---|
| 5,856,667 | A | 1/1999 | Spirig et al. |
| 6,825,455 | B1 | 11/2004 | Schwarte |
| 6,900,895 | B1 * | 5/2005 | Van Wiggeren ............ 356/477 |
| 2001/0048519 | A1 | 12/2001 | Bamji et al. |
| 2003/0164546 | A1 | 9/2003 | Giger |

FOREIGN PATENT DOCUMENTS

| | | |
|---|---|---|
| DE | 197 04 496 A1 | 3/1998 |
| DE | 198 21 974 A1 | 11/1999 |
| JP | 60170778 | 9/1985 |
| JP | 64-013110 | 1/1989 |
| JP | 1-100492 | 4/1989 |
| JP | 3-2582 | 8/1991 |
| JP | 7-10381 | 4/1995 |
| JP | 11-508359 | 7/1999 |
| JP | 2000-121332 | 4/2000 |
| JP | 2000-517427 A | 12/2000 |
| WO | WO-9701111 | 1/1997 |
| WO | WO-02/27352 A1 | 4/2002 |

OTHER PUBLICATIONS

T. Spirig et al., "The Lock-in CCD—Two-Dimensional Synchronous Detection of Light", IEEE Journal of Quantum Electronics, IEEE Inc., New York, U.S., vol. 31, No. 9, Sep. 1, 1995, pp. 1705-1708, XP000526180, ISSN: 0018-9197.

R. Schwarte et al., "New Optical Four-Quadrant Phase-Detector Integrated into a Photogate Array for Small and Precise 3D-Cameras", Proceedings of the SPIE, SPIE, Bellingham, VA, U.S., vol. 3023, Feb. 11, 1997, pp. 119-128, ISSN: 0277-786X.

Japanese Examination Report Application No. 2003-051926 Dated Nov. 11, 2005.

* cited by examiner

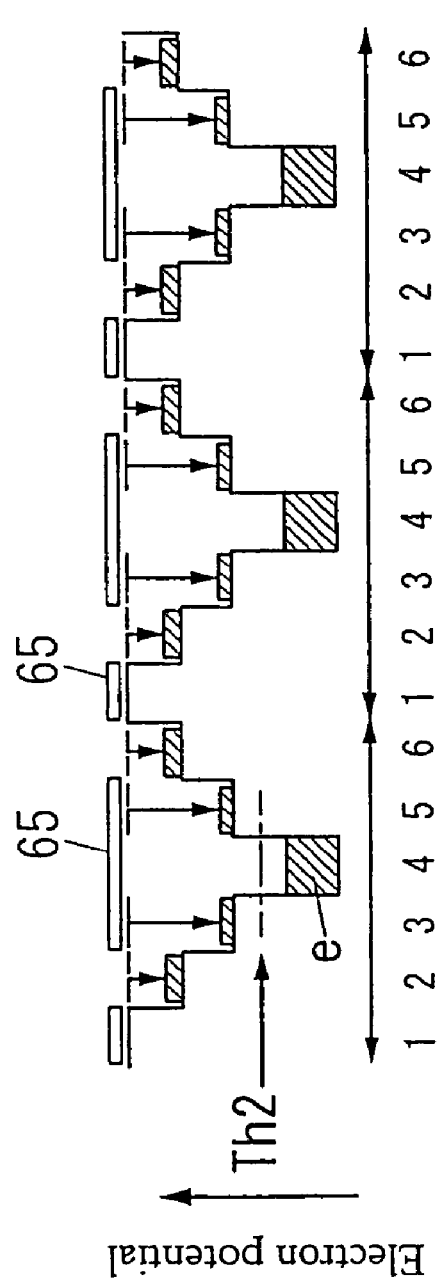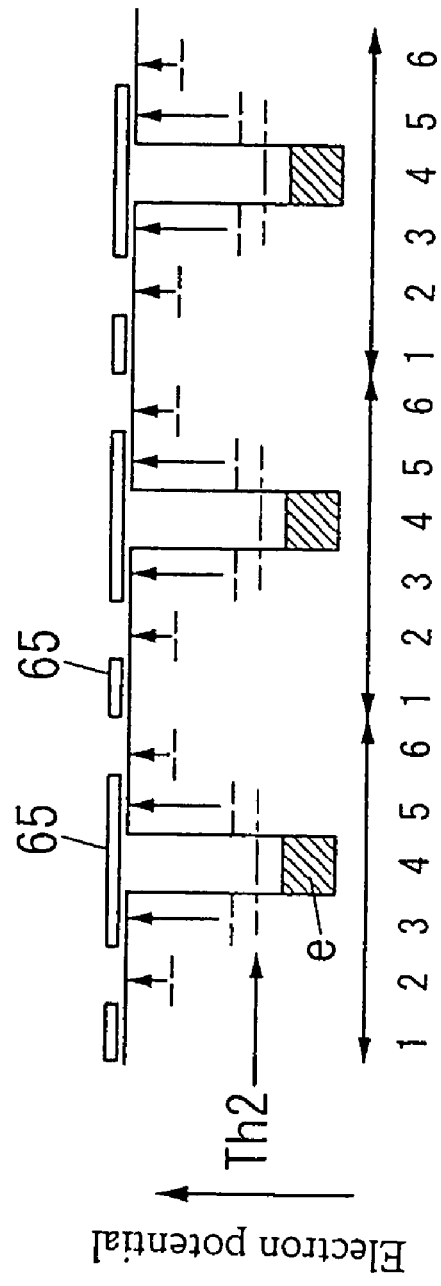
FIG. 26A
FIG. 26B

SPATIAL INFORMATION DETECTING DEVICE USING INTENSITY-MODULATED LIGHT AND A BEAT SIGNAL

TECHNICAL FILED

The present invention relates to a spatial information detecting device for receiving a light from a space into which an intensity-modulated light is being irradiated, and detecting information concerning the space such as a distance between an object in the space and the detecting device from the received light.

Background Art

A technique of detecting various information concerning a space by use of an intensity-modulated light has been known in the past. That is, the intensity-modulated light is irradiated from a light source into the space, and a light reflected from an object in the space is received by a photoelectric converter. According to the relationship between the intensity-modulated light and the received light, the spatial information can be obtained. In the present description, the spatial information includes a distance with object in the space, a change in the amount of received light brought by reflections on the object in the space, and so on. For example, the distance with the object can be determined from a phase difference between the intensity-modulated light and the received light. In general, this technique is called the time-of-flight method.

For example, U.S. Pat. No. 5,856,667 discloses apparatus and method using the time-of-flight method. According to the time-of-flight method, the light emitted from the light source is intensity-modulated by a required emission frequency, and the photoelectric converter detects the intensity of received light plural times within a time period shorter than a modulation period that is the reciprocal of the emission frequency. When the intensity of the light emitted from the light source is modulated by a sine wave, the intensity of received light is detected by the photoelectric converter at a certain phase of the modulated light. For example, the intensity of received light is detected 4 times within the modulation period, and the phase difference is determined from the detected four intensities of received light.

When the light emitted from the light source is intensity-modulated, as shown by the curve "S1" of FIG. 31, and the modulated light reflected from the object in the space is received by the photoelectric converter, the intensity of received light changes, for example, as shown by the curve "S2" of FIG. 31. In this case, the four intensities (A0', A1', A2', A3') of received light can be detected at 4 different phases (0°, 90°, 180°, 270°). However, in the present circumstances, it is impossible to detect the intensity of light received at just the moment of the each of the phases (0°, 90°, 180°, 270°). In the fact, each of the intensities of received light corresponds to the intensity of light received within a time width "Tw", as shown in FIG. 31.

On the assumption that the phase difference "ψ" does not change within the modulation period, and there is no change in light extinction ratio (In FIG. 31, the light extinction ratio is not considered) within a time period from the time of emitting the light to the time of receiving the light, the relationship between the intensities (A0', A1', A2', A3') of received light and the phase difference "ψ" can be represented by the following equation:

$$\psi = \arctan\{(A3'-A1')/(A0'-A2')\}$$

Thus, the technique of determining the phase difference (ψ) according to the intensities (A0', A1', A2', A3') of received light detected within the modulation period is available as a distance measuring method. A maximum distance "L" [m] that is measurable by this distance measuring method is approximately a half of wavelength of the sine wave to be intensity-modulated. That is, when "c" designates speed [$3.0 \times 10^8$ m/s] of light and "T" designates modulation period [s], the maximum distance "L" is represented by the equation: $L = c \cdot (T/2)$. Therefore, the modulation period "T" can be calculated by the equation: $T = 2L/c$. For example, when the maximum distance "L" is set to 3 m, the modulation period is 20 [ns] ($= 2 \times 3/(3.0 \times 10^8)$).

In the above case, the intensity of received light must be detected every quarter wavelength of the modulation period. This means that the intensity of received light must be detected under about 1 [ns] of the time width "Tw" every several nanoseconds [ns]. Therefore, a switching element having high-speed response is needed. In addition, when a distortion of the waveform of the light received by the photoelectric converter occurs due to a distortion of the signal waveform for driving the light source or a temporal change in the amount of light incoming from outside into the space, it becomes difficult to accurately determine the phase difference "ψ" according to the intensities of received light (A0', A1', A2', A3'). As a result, it leads to a reduction in distance measuring accuracy.

SUMMARY OF THE INVENTION

Therefore, a concern of the present invention is to provide a spatial information detecting device using an intensity-modulated light, which has the capability of accurately detecting information about the space such as a distance between an object in the space and the device without using an expensive switching device having high-speed response.

That is, the spatial information detecting device of the present invention comprises:

at least one photoelectric converter for receiving a light provided from a space into which a light intensity-modulated at a predetermined emission frequency is being irradiated, and generating an electrical output corresponding to an intensity of received light;

a local oscillator circuit for outputting a local oscillator signal having a local oscillator frequency different from the emission frequency;

a sensitivity controller for mixing the local oscillator signal with the electrical output to frequency convert the electrical output into a beat signal having a lower frequency than the emission frequency;

an integrator for performing integration of the beat signal at a predetermined timing; and an analyzer for determining information about the space according to an output of the integrator.

According to the present invention, even when a distortion of waveform of the light received by the photoelectric converter occurs due to a distortion of signal waveform for driving the light source or a temporal change in the amount of light incoming from outside into the space, it has little influence on integrals of the beat signal used to determine the spatial information. Therefore, there is an advantage that the spatial information can be accurately detected, as compared with conventional detecting devices for determining the spatial information with use of the waveform.

In addition, since the spatial information is determined by use of the integration of the beat signal having a lower frequency than the emission frequency of the intensity-modulated light, it is possible to use a relatively cheap switching device at the light receiving side in place of an expensive switching device having high-speed response. For example, when measuring time to determine the spatial information, the time measurement is performed with respect to the beat signal having the lower frequency than the emission frequency. Therefore, as compared with the case of measuring time without frequency conversion, it is possible to perform the time measurement with a relatively low degree of accuracy.

As a preferred embodiment of the present invention, the integrator performs the integration of the beat signal with respect to a plurality of integration ranges, each of which is determined within a given phase interval of the beat signal, and the analyzer includes determining a phase difference between the light irradiated into the space and the light received by the photoelectric converter from resultant integrals of the plurality of integration ranges. In this case, by using the phase difference between the light irradiated into the space and the light received by the photoelectric converter, it is possible to determine the spatial information such as a distance between an object in the space and the spatial information detecting device or a change in intensity of received light caused by reflection on the object in the space. In addition, since the integrals determined from the plurality of integration ranges of the beat signal are converted into the phase difference, it is not needed to synchronize with the light emitting side. As a result, it is possible to determine the distance by use of a relatively simple device structure.

It is preferred that the sensitivity controller comprises a semiconductor switch provided between the photoelectric converter and the integrator. In this case, since the semiconductor switch receives and gives electric charges between the photoelectric converter and the integrator, it is possible to use the semiconductor switch for frequency conversion in addition to selecting information for the integration.

As a further preferred embodiment of the present invention, the photoelectric converter generates, as the electrical output, amounts of electric charges corresponding to the intensity of received light. The integrator is provided with a charge storage for storing as signal charges at least part of electric charges generated by the photoelectric converter, and a charge ejector for ejecting the electric charges from the charge storage in synchronization with the beat signal having a frequency difference between the emission frequency and the local oscillator frequency. The sensitivity controller has a function of modulating, at the local oscillator frequency, a ratio of amounts of electric charges migrating to the charge storage relative to the amounts of electric charges generated by the photoelectric converter. Since the sensitivity of the light receiving side is controlled by the local oscillator frequency to obtain the beat signal, it is possible to easily achieve the purpose of the present invention with use of, as the photoelectric converter, a light receiving element, of which the sensitivity can be adjusted by the signal of the local oscillator frequency.

It is also preferred that the charge storage stores the signal charges of a plurality of ranges, each of which is determined within a given phase interval of the beat signal, and the analyzer includes determining a phase difference between the light irradiated into the space and the light received by the photoelectric converter from the stored signal charges of the plurality of ranges. In this case, by using the phase difference between the light irradiated into the space and the light received by the photoelectric converter, it is possible to determine the spatial information such as a distance between an object in the space and the spatial information detecting device or a change in intensity of received light caused by reflection on the object in the space.

In addition, it is preferred that the sensitivity controller comprises a storage gate provided between the photoelectric converter and the charge storage to adjust amounts of electric charges migrating from the photoelectric converter to the charge storage, and/or a charge discarding unit for removing, as unnecessary charges, at least part of the electric charges generated by the photoelectric converter. In this case, since amounts of electric charges discarded from the photoelectric converter is controlled to adjust the mounts of electric charges migrating from the photoelectric converter to the charge storage, it is possible to separately control the timing of controlling the charge discarding unit and the timing of storing electric charges in the charge storage to perform the frequency conversion, and accordingly minimize amounts of noise components mixed into the signal charges. In addition, when the sensitivity controller has both of the storage gate and the charge discarding unit, it is possible to control discarding the unnecessary charges, while simultaneously performing the frequency conversion and storing the signal charges.

As another preferred embodiment of the present invention, the spatial information detecting device has a plurality of photoelectric converters. The charge storage of the integrator is a CCD (charge-coupled device) having a region of storing, as signal charges, at least part of electric charges generated by each of the photoelectric converters at a region corresponding to a gate electrode provided every photoelectric converter. The charge ejector is a CCD for transferring the signal charges from the charge storage to outside. The charge discarding unit is formed with an overflow drain for discarding at least part of electric charges generated by each of the photoelectric converters in a batch manner according to an external signal. The photoelectric converters, the charge storage, the charge ejector, and the charge discarding unit are mounted on a single semiconductor substrate to obtain an image sensor. The sensitivity controller is at least one of the gate electrode and the charge discarding unit. In this case, as the image sensor for the spatial information detecting device of the present invention, an interline transfer CCD image sensor having an overflow drain or a frame transfer CCD image sensor having an overflow drain can be used. Therefore, it is possible to readily achieve the purpose of the present invention without using special circuit designs or devices.

It is further preferred that the image sensor has a light shielding film on regions of storing electric charges and not relating to the generation of electric charges. It is possible to prevent the generation of noise components at the photoelectric converters and improve the S/N ratio.

It is also preferred that the sensitivity controller is at least one of the gate electrode and the charge discarding unit, and a voltage applied to the gate electrode and/or an external signal to be given to the charge discarding unit is modulated by the local oscillator frequency. In this case, since the overflow drain of the CCD image sensor is modulated by the local oscillator frequency, it is possible to perform the frequency conversion independently with the timing of storing the signal charges in the charge storage, and accordingly minimize the amounts of noise components mixed into the signal charges. In addition, when the sensitivity controller is composed of the gate electrode and the charge discarding unit, it is possible to control discarding the unnecessary charges, while simultaneously performing the frequency conversion and storing the signal charges.

As still another preferred embodiment of the present invention, the spatial information detecting device has a plurality of photoelectric converters, and a set of photoelectric converters is selected from the plurality of photoelectric converters to define one pixel. A plurality of sensitivity controllers corresponding to the photoelectric converters of the set are modulated by local oscillator signals having a same local oscillator frequency and different phases from each other. The charge ejector simultaneously outputs the signal charges corresponding to the different phases of the beat signal obtained by the photoelectric converters of the set. In this case, since the signal charges corresponding to the different phases of the beat signal are simultaneously obtained, it is possible to more efficiently detect the spatial information.

Moreover, it is preferred that the analyzer includes determining a phase difference between the light irradiated into the space and the light received by the photoelectric converter from the signal charges corresponding to the different phases of the beat signal. Since the signal charges stored in the plurality of ranges of the beat signal are converted into the phase difference, it is not needed to synchronize with the light emitting side. Accordingly it is possible to determine the spatial information by use of a relatively simple device structure.

In addition, it is preferred that the analyzer includes converting the phase difference into distance information. In this case, a distance measuring device can be provided as the spatial information detecting device.

These and still other objects and advantages of the present invention will become more apparent from the best mode for carrying out the invention explained below, referring to the attached drawings.

BRIEF DESCRIPTION OF THE DRAWINGS

FIGS. 26A and 26B are explanatory diagram illustrating the principle of operation of a distance measuring device according to a tenth embodiment of the invention.

BEST MODE FOR CARRYING OUT THE INVENTION

In preferred embodiments described below, as an example of a spatial information detecting device of the present invention, distance measuring devices using a phase difference between an intensity-modulated light and a received light by a photoelectric converter are explained in detail. However, needless to say, the present invention is not limited to those distance measuring devices. It should be interpreted that the technical idea of the present invention is available to any devices required to determine the above-described phase difference.

(First Embodiment)

Figure 1:
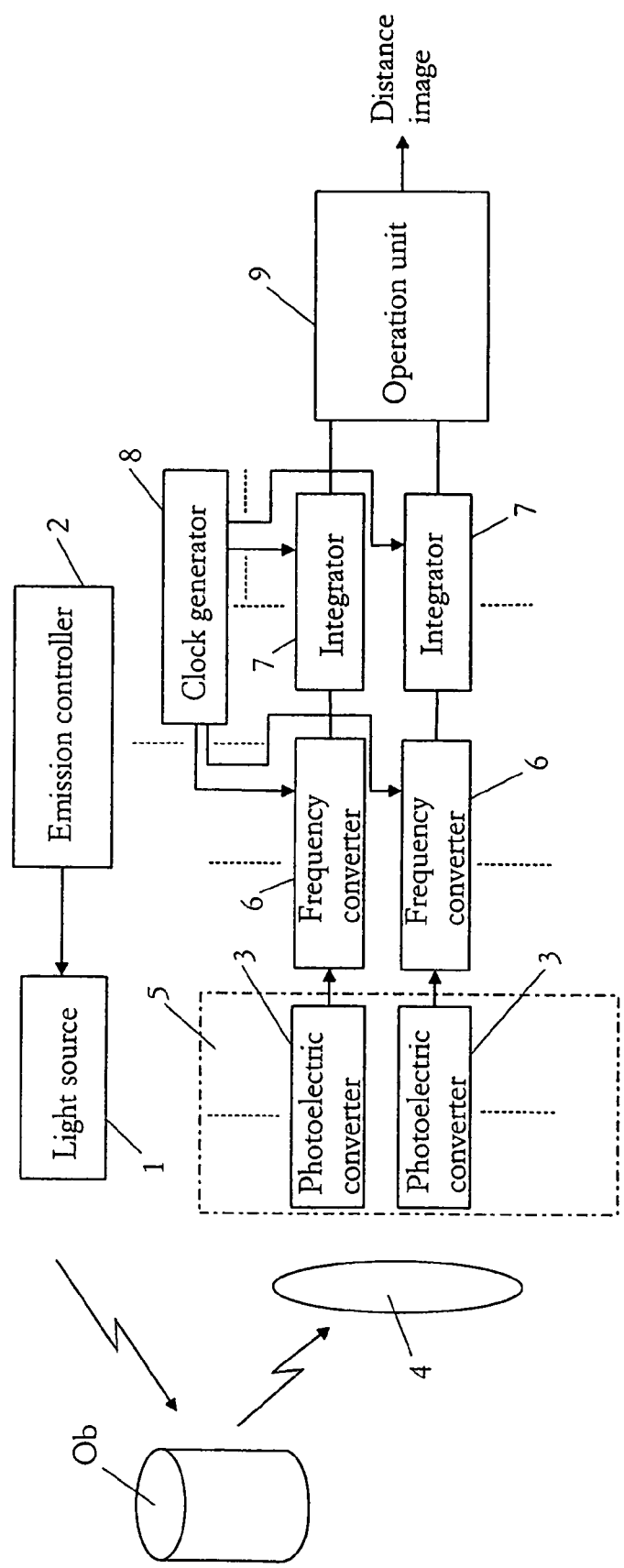
FIG. 1 is a block diagram of a distance measuring device according to a first embodiment of the invention.

As shown in FIG. 1, the distance measuring device of this embodiment has a light source 1 for emitting a light into a required space. The light emitted from the light source is intensity-modulated at a predetermined emission frequency by an emission controller 2. As the light source 1, for example, it is possible to use an array of light emitting diodes (LED) or a combination of a semiconductor laser and a divergent lens. As an example, the emission controller 2 intensity-modulates the light emitted from the light source 1 by a sine wave of 20 MHz.

In addition, the distance measuring device has a plurality of photoelectric converters 3 for receiving a light provided from the space through a lens 4. Each of the photoelectric converters 3 generates an electric output corresponding to an intensity of received light. In other words, the photoelectric converter 3 outputs a receiver signal with a signal level corresponding to the intensity of received light. For example, a matrix array of 100×100 photoelectric converters is used as an image sensor 5. 3-dimensional information of the space, into which the light of the light source is being irradiated, is mapped on a 2-dimensional planar surface that is a light receiving surface of the image sensor 5 through the lens 4. For example, when an object "Ob" exists in the space, a light reflected from each point of the object is received by a corresponding photoelectric converter. By detecting a phase difference between the light emitted from the light source and the light received by the photoelectric converter, a distance between the distance measuring device and each point of the object can be determined.

Figure 2:
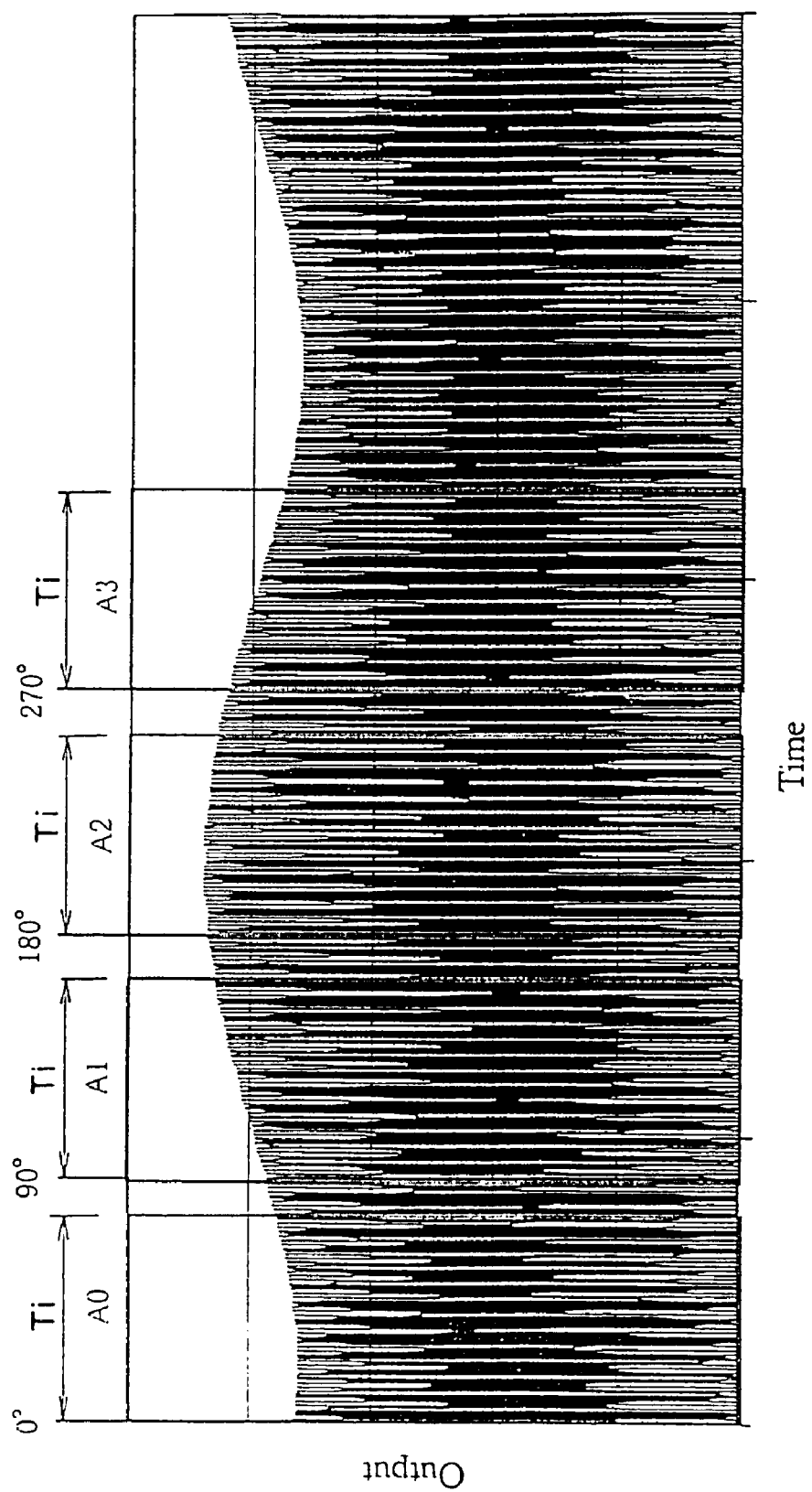
FIG. 2 is an explanatory diagram illustrating the principle of operation of the distance measuring device.

The electrical output of each of the photoelectric converters 3 is input in a frequency converter 6 that functions as a sensitivity controller. In this frequency converter 6, frequency conversion is performed such that the frequency of the electrical output (=receiver signal) becomes to be smaller than the emission frequency. That is, the frequency converter 6 mixes the receiver signal of the photoelectric converter with a local oscillator signal output from a clock generator 8 to generate a beat signal including an envelope component corresponding to a difference between the emission frequency and the frequency of the local oscillator signal, as shown in FIG. 2. Thus, the clock generator 8 functions as a local oscillator circuit.

When there is no temporal change in the distance between the measuring device and the object "Ob", the phase of the beat signal is determined according to a relationship among the phase of the light emitted from the light source 1, the phase of the local oscillator signal provided from the local oscillator circuit and the phase of the receiver signal output from the photoelectric converter 3. That is, an intensity (Y 1) of the receiver signal is represented by the following equation:

$$Y1 = b1 + a1l \cdot \cos(\omega 1 \cdot t + \psi)$$

wherein "ω1" designates an angular frequency corresponding to the emission frequency, "ψ" designates a phase difference between the phase of the light emitted from the light source and the phase of the receiver signal, "a 1" designates a constant corresponding to an amplitude of the receiver signal, and "b 1" designates a constant corresponding to dark current or outside light (temporal change is not considered). On the other hand, an intensity (Y 2) of the local oscillator signal is represented by the following equation:

$$Y2 = b2 + a2 \cdot \cos(\omega 2 \cdot t)$$

wherein "ω2" designates an angular frequency, "a 2" designates a constant corresponding to an amplitude of the local oscillator signal, and "b 2" designates a constant corresponding to a direct bias.

Since the mixed signal of the receiver signal and the local oscillator signal is (Y1·Y2), the beat signal having the envelope component corresponding to the difference between the emission frequency and the frequency of the local oscillator signal can be obtained. The phase difference "ψ" is directly reflected in the phase of the envelope component. In other words, the time corresponding to the phase difference "ψ" of the beat signal is obtained by multiplying the time corresponding to the phase difference of the receiver signal by {period of the beat signal/modulation period}.

When the difference between the emission frequency and the frequency of the local oscillator signal is relatively small, time corresponding to the phase difference "ψ" can be remarkably prolonged as compared with the conventional method. For example, when the emission frequency is 20 MHz, the one period is 50 ns. Therefore, according to the conventional method, data sampling of the intensity of received light must be performed every short time period that is less than a quarter of 50 ns to determine the phase difference "ψ". On the other hand, according to the present invention, when the difference between the emission frequency and the frequency of the local oscillator signal is for example 300 kHz, one period of the beat signal is approximately 3300 ns (=1/(3×10$^5$)). Therefore, the data sampling of the intensity of received light can be performed every relatively long time period less than a quarter of 3300 ns (for example, 700 ns) to determine the phase difference "ψ".

Thus, to determine the phase difference "ψ", the intensities of received light detected within one period of the beat signal can be used in place of the intensities of received light detected within the modulation period of the light emitted from the light source. That is, as shown in FIG. 2, integration of the beat signal over a required integration range "Ti" are performed plural times within one period of the beat signal at the timing of a given phase interval. The phase difference "ψ" can be determined by use of the plural integrals determined within one period of the beat signal. In FIG. 2, each of the integrals (A0, A1, A2, A3) is calculated every 90 degrees of the phase interval, i.e., 0°, 90°, 180° and 270°, within one period of the beat signal. The phase difference "ψ" is obtained by substituting those integrals (A0, A1, A2, A3) into the following equation:

$$\psi = \tan^{-1}\{(A3-A1)/(A0-A2)\}.$$

When the difference between the emission frequency and the local oscillator frequency is controlled to be substantially zero or extremely small, it is possible to determine the phase difference "ψ" even when generating the local oscillator signal without synchronizing with the light emitted from the light source 1. That is, as shown in FIG. 1, the beat signal output from the frequency converter 6 is input in the integrator 7. The integration is performed every quarter of period of the beat signal in synchronization with the clock signal output from the clock generator 8 to determine the integration timing and the integration range at the integrator 7. The obtained integrals of the beat signal are input in a distance operation unit 9. This operation unit 9 includes an analyzer for determining the phase difference "ψ" from the integrals provided from the integrator 7 to convert the phase difference "ψ" into the distance between the distance measuring device and the object "Ob".

In the above case, the integration is performed four times within one period of the beat signal. However, the number of times of performing the integration can be appropriately determined. In addition, in the above case, the integration is performed every quarter of period of the beat signal. However, when the phase interval is predetermined, it is not required to adopt equally spaced phase intervals, and set the phase interval within one period of the beat signal.

As described above, since the integrals of the beat signal having a frequency sufficiently lower than the emission frequency are used to determine the phase difference "ψ", it is possible to achieve a remarkably high S/N ratio against noise components such as dark current or outside light. In addition, the detection accuracy of the phase difference "ψ" is relatively improved, as compared with the case of determining the phase difference "ψ" directly from the receiver signal of the photoelectric converter. In the above case, the light emitted from the light source is intensity-modulated by the sine wave. However, the intensity-modulation may be performed by use of another waveform such as a triangular wave or a saw-tooth wave. In addition, as the light emitted from the light source, infrared light or the like may be used other than the visible light. Under the influence of disturbance light such as sun light and illumination, it is preferred that an optical filter for transmitting only a wavelength of the light emitted from the light source is placed before the photoelectric converters 3. The use of this optical filter is useful too in the following embodiments.

(Second Embodiment)

Figure 3:
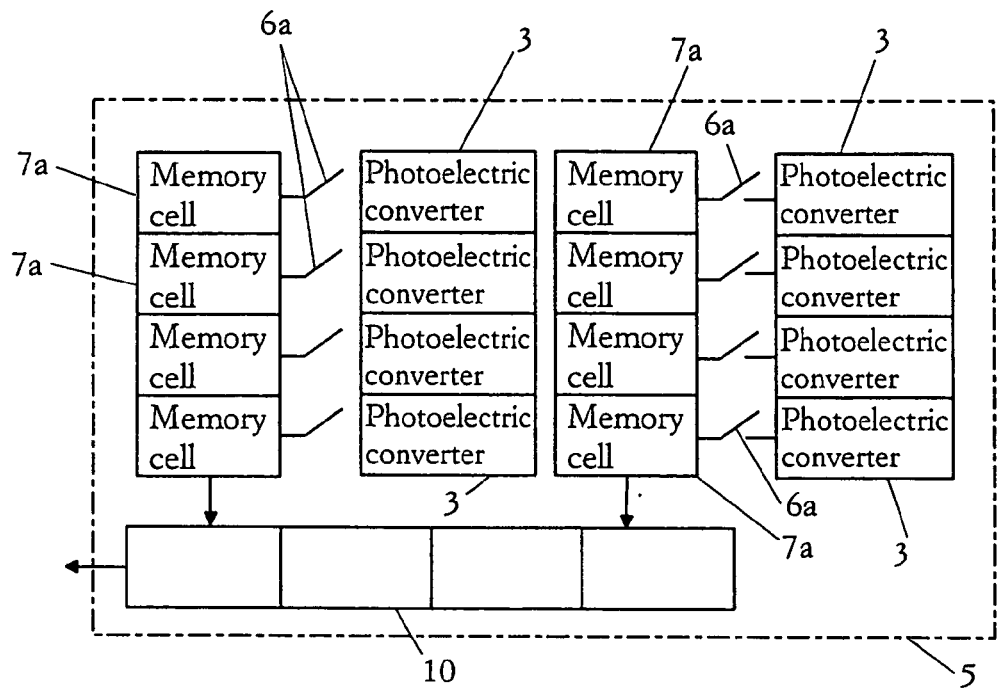
FIG. 3 is a schematic diagram of an image sensor for a distance measuring device according to a second embodiment of the invention.

In the first embodiment, the photoelectric converters 3, frequency converters 6, and the integrators 7 are independent of one another. In this embodiment, they are integrally formed as an image sensor 5. That is, as shown in FIG. 3, the image sensor 5 comprises photoelectric converters 3 such as photodiodes, each of which generates, as the receiver signal, amounts of electric charges corresponding to the intensity of received light, memory cells 7a for storing the electric charges generated in the photoelectric converters 3, storage gates 6a, each of which adjusts the amounts of electric charges migrating from the photoelectric converter 3 to the corresponding memory cell 7a, and a transfer circuit 10 that functions as a charge ejector for ejecting the electric charges stored in each of the memory cells 7a to outside The storage gate 6a is switched by the local oscillator signal output from a clock generator 8, so that amounts of signal charges corresponding to a beat signal are stored in the memory cell 7a. Therefore, in this embodiment, a frequency converter 6 is composed of the storage gate 6a and the clock generator 8. In addition, since the migration amounts of electric charges from the photoelectric converter 3 to the memory cell 7a as the charge storage can be adjusted by controlling the storage gate 6a by the local oscillator signal, it can be regarded that the storage gate 6a also functions as a sensitivity controller for determining a ratio of the amounts of electric charges to be supplied as the signal charges into the memory cell 7a relative to the amounts of electric charges generated in the photoelectric converter 3.

As described above, the memory cell 7a stores, as the signal charges, the electric charges generated by the photoelectric converter 3 when the storage gate 6a is in the "on" state. Thus, the memory cell 7a functions as the integrator 7 explained in the first embodiment. It is required to read out an output of the integrator 7 plural times within one period of the beat signal. In this embodiment, the transfer circuit 10 reads out the integral stored in each of the memory cells 7a every time period appropriately determined according to the period of the beat signal. The read-out integral is then sent to an operation unit 9 as the analyzer of the first embodiment. In the operation unit 9, the phase difference "ψ" between the light emitted from the light source 1 and the light received by the photoelectric converter 3 is determined by performing the operations described in the first embodiment and a distance between the object "Ob" and the distance measuring device is determined from the phase difference "ψ" to output an distance image.

By the way, as the photoelectric converter 3, it is possible to use a photodiode or a MOS capacitor having the capability of photoelectric conversion. On the other hand, as the memory cell 7a, it is possible to use a MOS capacitor light-shielded to prevent receiving the outside light. When a CCD is used as the MOS capacitor for the memory cell 7a, a shift gate for transferring the electric charges from the photoelectric converter 3 to the memory cell 7a can be used as the storage gate 6a. Alternatively, a MOS capacitor having the capability of separately providing electric charges may be used for the memory cell 7a. As the storage gate 6a, it is also possible to use a conventional semiconductor switch such as bipolar transistor and MOSFET. The shift gate or the semiconductor switch used as the storage gate 6a is light-shielded to prevent receiving the outside light. Alternatively, as the storage gate 6a, a MOS type device integrally formed with the photoelectric converter 3 may be used. For example, such a MOS type device comprises one having the capability of controlling the bias of a MOS capacitor and a MOS transistor. In this case, the outside light is incident on the storage gate 6a without being light-shielded. A one- or two-dimensional type image sensor may be used as the image sensor 5.

The transfer circuit 10 can be appropriately designed according to the type of the memory cell 7a used. For example, when a plurality of memory cells 7a constructs a CCD, the electric charges of each of the memory cells 7a can be read out in order by driving the CCD with readout pulse. On the other hand, in case of separately providing the electric charges from the memory cells 7a, the electric charges of each of the memory cells 7a can be read out in order by individually performing on/off operation of a MOS transistor of the semiconductor switch placed between each of the memory cells 7a and the operation unit 9.

Figure 4:
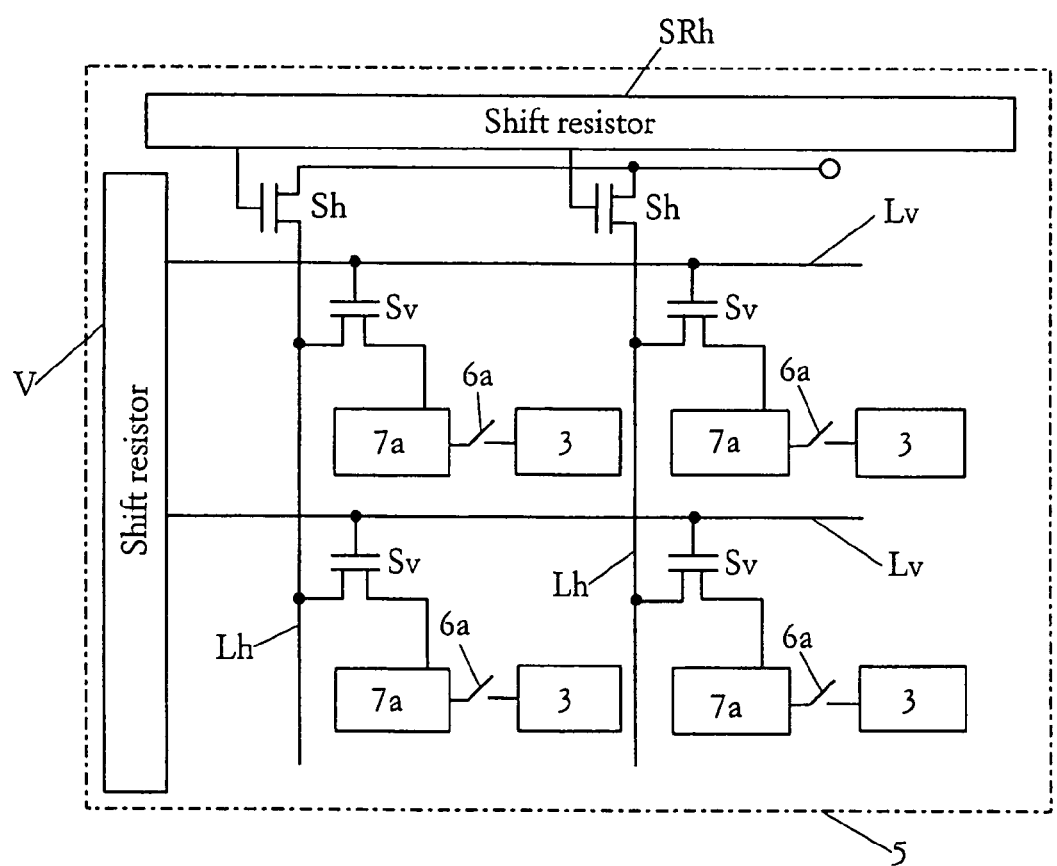
FIG. 4 is a schematic diagram of another image sensor for the distance measuring device according to the second embodiment.

Referring to FIG. 4, the case of separately providing the electric charges from the memory cells 7a is further explained in detail. In the present case, a 2-dimensional matrix arrangement of the photoelectric converters 3 is used. The drain of a semiconductor switch "Sv" for vertical control that is composed of a MOS transistor is connected to the memory cell 7a corresponding to each of the photoelectric converters 3. The gates of the semiconductor switches "Sv" corresponding to the photoelectric converters aligned in the horizontal direction are commonly connected to a horizontal signal line "Lv". The gates of the semiconductor switches "Sv" commonly connected every row of the matrix arrangement are connected to a shift resistor "SRv" for vertical control. The shift resistor "SRv" can selectively turn on the semiconductor switches "Sv" corresponding to one of the rows of the matrix arrangement. On the other hand, the source of the semiconductor switches "Sv" corresponding to the photoelectric converters 3 aligned in the vertical direction are commonly connected to a vertical signal line "Lh". The sources of the semiconductor switches "Sv" commonly connected every column of the matrix arrangement are connected to the drain of a semiconductor switch "Sh" for horizontal control that is composed of a MOS transistor. The gates of the semiconductor switches "Sh" are connected to a shift resistor "SRh" for horizontal control. The shift resistor "SRh" can selectively turn on the semiconductor switch "Sh" corresponding to one of the columns of the matrix arrangement. The source of each of the semiconductor switches "Sh" is commonly connected to an output line "Lo".

Therefore, when the semiconductor switches "Sh" aligned in the horizontal direction are turned on in order by the shift resistor "SRh" under a condition that the semiconductor switches "Sv" corresponding to one of the rows of the matrix arrangement are turned on by the shift resistor "SRv", it is possible to provide the electric charges of each of the memory cells 7a corresponding to the row of the matrix arrangement to the signal line. Next, when the semiconductor switches "Sh" aligned in the horizontal direction are turned on in order by the shift resistor "SRh" under a condition that the semiconductor switches "Sv" corresponding to another one of the rows of the matrix arrangement are turned on by the shift resistor "SRv", it is possible to provide the electric charges of each of the memory cells 7a corresponding to another row of the matrix arrangement to the signal line. Thus, by repeating the above procedure, it is possible read out the signal charges stored in the memory cells 7a in order. Thus, each of the shift resistors "SRh" and "SRv" functions as a controller for controlling the on/off state of the semiconductor switch "Sh" or "Sv" such that each of the memory cells 7a is selectively connected to the output line. Other configuration and operation are similar to the first embodiment.

(Third Embodiment)

In this embodiment, an interline transfer CCD having a vertical-overflow drain is used as the image sensor 5. As this type of image sensor, it is possible to use one available in the market.

Figure 5:
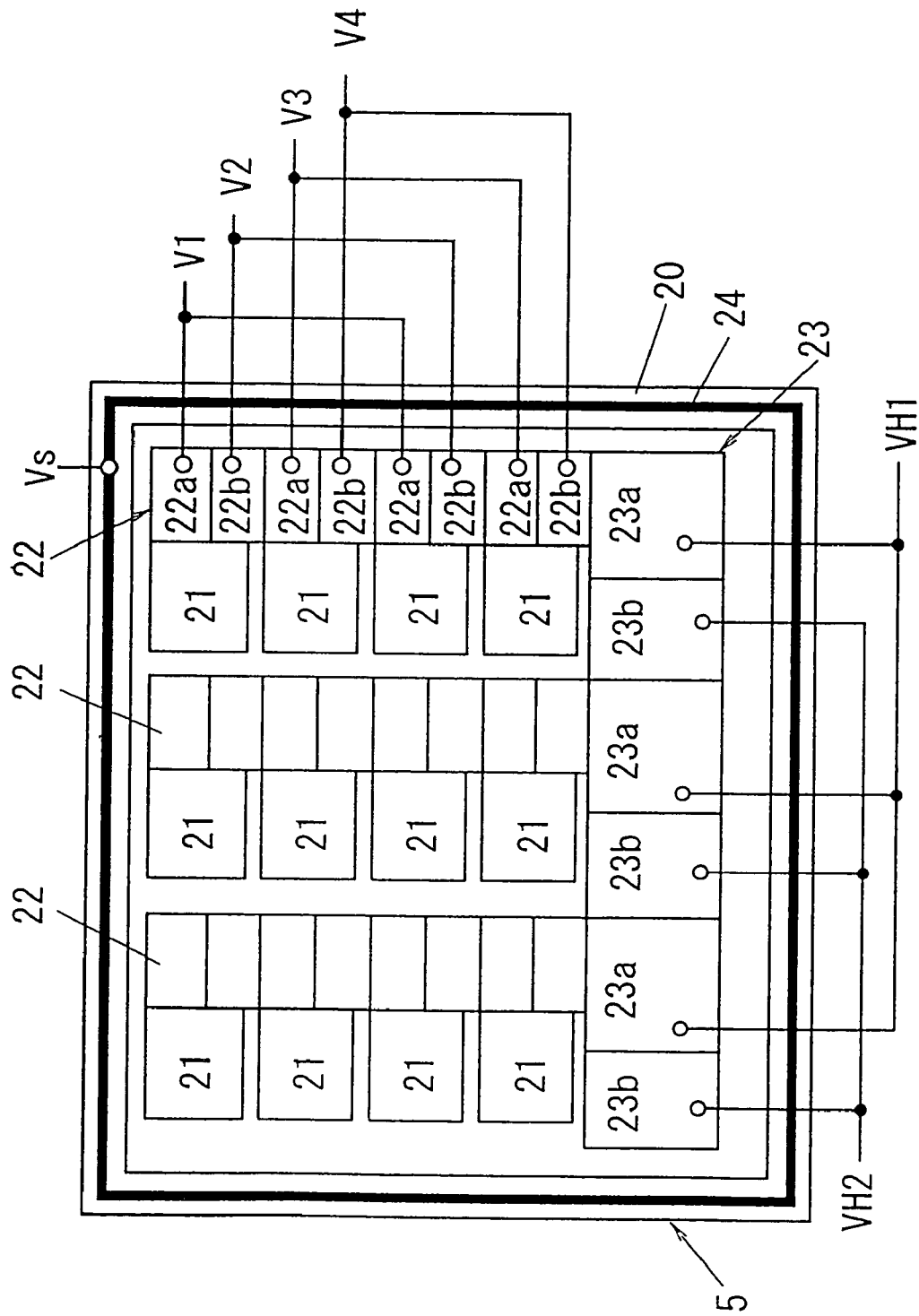
FIG. 5 is a plan view of an image sensor of a distance measuring device according to a third embodiment of the invention.

As shown in FIG. 5, the image sensor 5 is a 2-dimensional image sensor having a matrix arrangement of 3×4 photodiodes 21. The numeral 22 designates a vertical transfer portion composed of a vertical transfer CCD provided adjacent to the photodiodes 21 of each of the columns of the matrix arrangement. The numeral 23 designates a horizontal transfer portion composed of a horizontal transfer CCD provided under the vertical transfer portions. Each of the vertical transfer portions 22 has a pair of gate electrodes (22a, 22b) every photodiode 21. The horizontal transfer portion has a pair of gate electrodes (23a, 23b) every vertical transfer portion 22. The vertical transfer portion 22 is a 4-phase drive, and the horizontal transfer portion 23 is a 2-phase drive. Therefore, the horizontal transfer portion 23 receives the signal charges every one horizontal line from the vertical transfer portions 22 and outputs the signal charges every one horizontal line. Since this type of driving technique is well known in the field of CCD, the detailed explanation is omitted.

The photodiodes 21, the vertical transfer portions 22 and the horizontal transfer portion 23 are formed on a single substrate 20. An overflow electrode 24 that is an aluminum electrode is directly formed on the substrate 20 not through an insulating film. That is, the substrate 20 functions as the overflow drain. The overflow electrode 24 is formed on the substrate 20 so as to surround the whole of the photodiodes 21, the vertical transfer portions 22 and the horizontal transfer portion 23, as shown in FIG. 5. The surface of the substrate 20 other than areas corresponding to the photodiodes 21 is covered with a light shielding film 26 (FIG. 6) described later.

Figure 6:
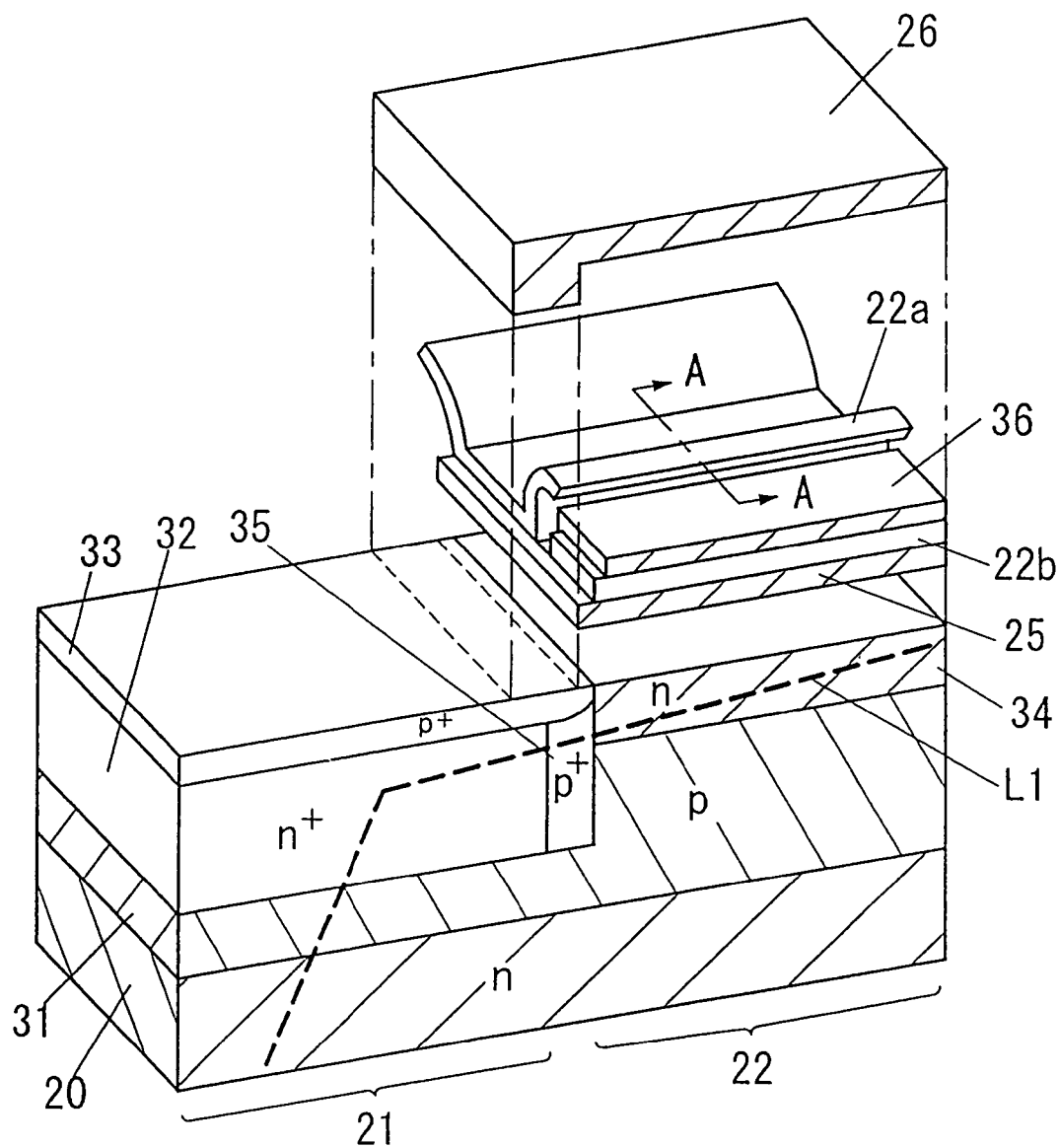
FIG. 6 is an exploded perspective view of a relevant portion of the image sensor.

Referring to FIG. 6, the image sensor 5 is more specifically explained. In the present embodiment, an n-type semiconductor substrate is used as the substrate 20. A p-well 31 of p-type semiconductor is formed on a general surface of the substrate 20 over a region, at which the formation of the photodiode 21 and the vertical transfer portion 22 is intended, such that a thickness of the p-well at the region for the formation of the vertical transfer portion 22 is greater than the thickness of the p-well at the region for the formation of the photodiode 21. In addition, an $n^+$-type semiconductor layer 32 is formed at the region for the formation of the photodiode 21 on the p-well 31. As a result, the p-n junction provided by the $n^+$-type semiconductor layer 32 and the p-well 31 provides the photodiode 21. A $p^+$-type semiconductor surface layer 33 is formed on photodiode 21. This surface layer 33 is known as buried photodiode.

On the other hand, a storage transfer layer 34 of n-type semiconductor is formed at the region for the formation of the vertical transfer portion 22 on the p-well 31. The top surface of the storage transfer layer 34 is substantially flush with the top surface of the surface layer 33, and the thickness of the storage transfer layer 34 is greater than the thickness of the surface layer 33. A separation layer 35 of $p^+$-type semiconductor having the same impurity concentration as the surface layer 33 is formed between the $n^+$-type semiconductor layer 32 and the storage transfer layer 34. The gate electrodes 22a, 22b are formed on the storage transfer layer 34 through an insulating film 25. The gate electrode 22a is insulated from the gate electrode 22b by the insulating film 25. As described above, the gate electrodes 22a, 22b are formed every photodiode 21. One of the gate electrodes 22a, 22b has a larger width than the other one.

Figure 7:
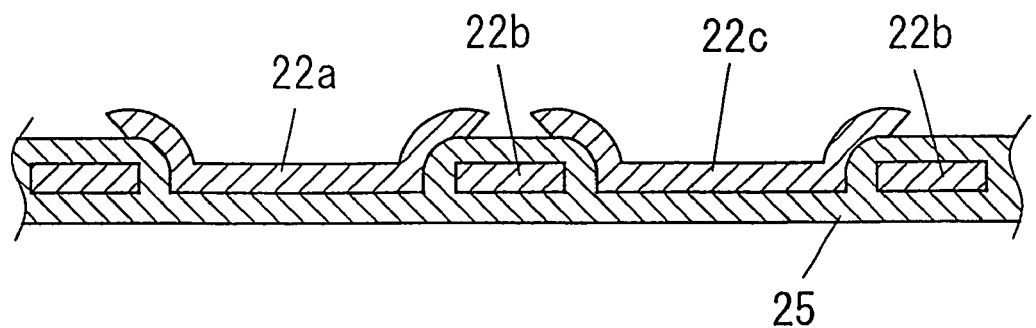
FIG. 7 is a cross-sectional view cut along the line A—A of FIG. 6 or 11.

Specifically, as shown in FIG. 7, the gate electrode 22b having the small width is configured in a planar shape, and the gate electrode 22a having the large width is formed with a flat portion and a pair of curved portions extending from opposite ends of the flat portion. The gate electrodes 22a, 22b are disposed such that the curved portion of the gate electrode 22a is partially overlapped with the gate electrode 22b in the height direction. The top surface of the flat portion of the gate electrode 22a is substantially flush with the top surface of the gate electrode 22b. Therefore, the gate electrodes 22a, 22b are alternately disposed on the storage transfer layer over the entire length of the vertical transfer portion 22. The insulating film 25 is made of silicon dioxide. The gate electrodes 22a, 22b are made of polysilicon. In addition, the surface of the image sensor 5 other than regions for allowing the photodiodes to receive the light is covered with a light-shielding film 26.

Next, a mechanism of driving the image sensor 5 described above is explained. When the light provided from the space is incident on the photodiode 21, electric charges are generated by the photodiode 21. After the electric charges generated by the photodiode 21 are supplied to the vertical transfer portion 22, they can be stored in the vertical transfer portion 22 or transferred from the vertical transfer portion 22 by controlling voltages applied to the gate electrodes 22a, 22b. That is, the gate electrodes 22a, 22b function as the storage gate. A ratio of amounts of the electric charges supplied to the vertical transfer portion 22 relative to the amounts of the electric charges generated by the photodiode 21 changes in accordance with a depth of a potential well formed in the storage transfer layer 34 by applying the voltages to the gate electrodes 22a, 22b and the time period of forming the potential well. In addition, when a suitable voltage "Vs" is applied to the overflow electrode 24, the electric charges generated by the photodiode 21 are discarded through the substrate 20. Therefore, the ratio of amounts of the electric charges supplied to the vertical transfer portion 22 relative to the amounts of the electric charges generated by the photodiode 21 can be determined by controlling the voltage applied to the overflow electrode 24 or the time period of applying the voltage to the overflow electrode. Thus, the substrate 20 functions as an electric-charge discarding portion.

As described above, the photodiode 21 functions as the photoelectric converter, and the amounts of the electric charges supplied as the signal charge from the photodiode 21 to the vertical transfer portion 22 can be adjusted by controlling the voltage applied to at least one of the gate electrodes 22a, 22b and the overflow electrode 24. Therefore, it can be regarded that at least one of the gate electrodes 22a, 22b and the overflow electrode 24 (i.e., the substrate 20 as the electric-charge discarding portion) functions as the sensitivity controller. In other words, when the voltage corresponding to the local oscillator signal is applied to at least one of the gate electrodes 22a, 22b and the overflow electrode 24, it can function as the sensitivity controller. In addition, the vertical transfer portion 22 can form the potential well at the region corresponding to the individual gate electrode 22a, 22b. Since the signal charges can be stored in the potential well, the potential well functions as the electric charge storage. Since the electric charges stored in the vertical transfer portion 22 can be output by controlling a magnitude of the voltage applied to the gate electrode 22a, 22b, 23a, 23b and timing of applying the voltage to the gate electrode, the vertical transfer portion 22 and the horizontal transfer portion function as the electric charge ejector.

Figure 8:
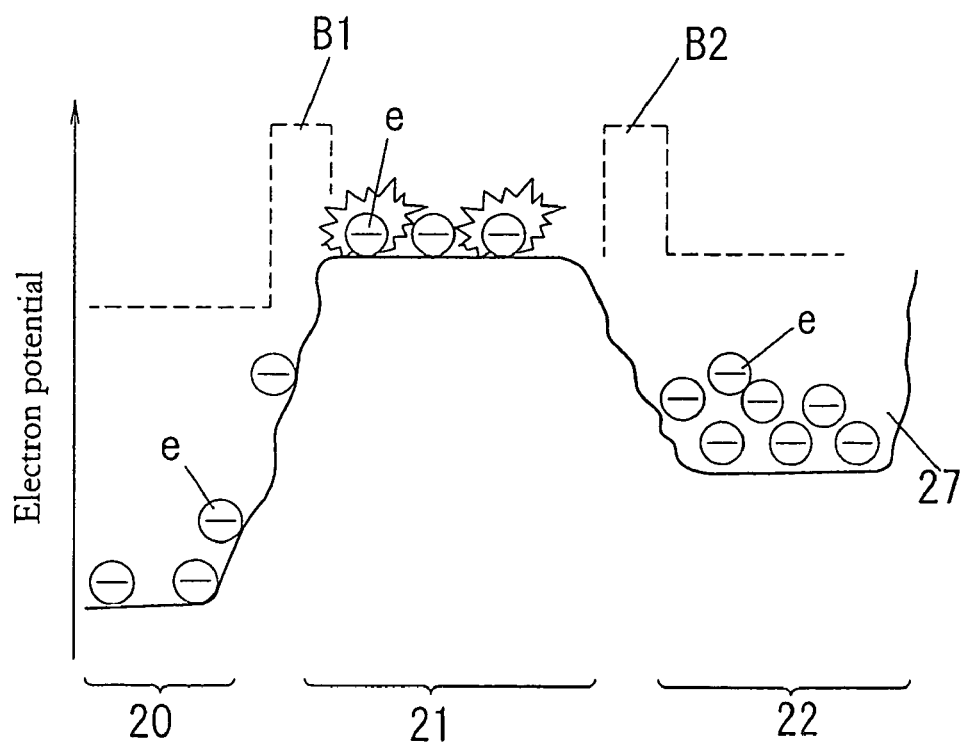
FIG. 8 is an explanatory diagram illustrating the principle of operation of the distance measuring device.

For example, when controlling the voltage applied to the overflow electrode 24, the electric charges generated by the photodiode 21 can migrate toward the vertical transfer portion 22, as described below. That is, FIG. 8 is a schematic diagram showing a change in electron potential along the dotted-line "L1" in FIG. 6. The region designated by the numeral 21 in FIG. 8 corresponds to the photodiode. The region designated by the numeral 20 in FIG. 8 corresponds to the substrate. The region designated by the numeral 22 in FIG. 8 corresponds to the vertical transfer portion. When the voltage is not applied to the overflow electrode 24, the potential barrier "B1" derived from the p-well 31 is formed between the photodiode 21 and the substrate 20. In addition, when the voltages are not applied to the gate electrodes 22a, 22b, a potential barrier "B2" derived from the separation layer 35 is formed between the photodiode 21 and the vertical transfer portion 22. Therefore, the height of the potential barrier "B2" can be controlled by the voltage applied to the gate electrode 22a, 22b. Similarly, the height of the potential barrier "B1" can be controlled by the voltage applied to the overflow electrode 24. In FIG. 8, "e" designates electron.

By the way, it has been known from the past that when applying a voltage to the overflow electrode 24 at an appropriate timing, it can function as an electronic shutter. When the voltage applied to the overflow electrode 24 is controlled, and a relatively high voltage is applied to the substrate 20, the electric charges generated by the photodiode 21 can be discarded as waste charges through the substrate 20. In other words, the amounts of electric charges supplied to the vertical transfer portion 22 can be controlled. This means that the sensitivity is adjustable.

In the present embodiment, the sensitivity is adjusted by applying the voltage corresponding to the local oscillator signal to the overflow electrode 24, and the ratio of the amounts of electric charges supplied to the vertical transfer portion 22 relative to the amounts of electric charges generated by the photodiode 21 is modulated at the local oscillator signal. That is, frequency conversion is performed by mixing the receiver signal of the photodiode 21 (i.e., the electrical output generated by the photodiode 21) with the local oscillator signal provided from the clock generator 8.

In addition, since the gate electrodes 22a, 22b are formed on the storage transfer layer 34 through the insulating film 25, the potential well is formed in the storage transfer layer 34 by applying the voltage to the gate electrode 22a, 22b, so that a capacitor for storing the electric charges can be obtained. Therefore, it is possible to perform integration within a capacity range determined by the depth and width of the potential well 27.

Figure 9A:
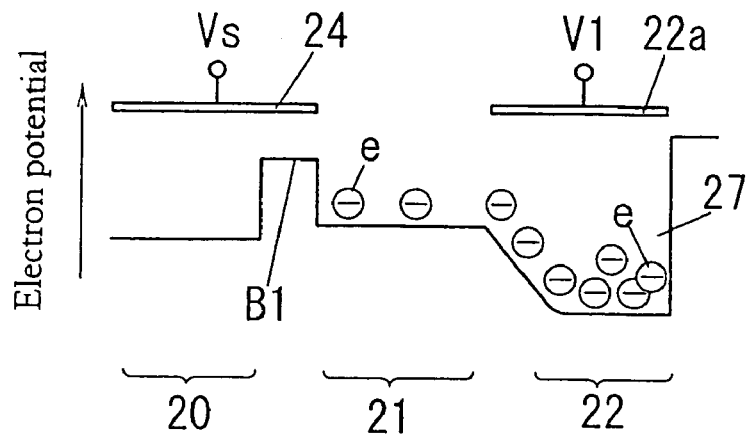
FIGS. 9A to 9C are explanatory diagrams illustrating the principle of operation of the distance measuring device.
Figure 9B:
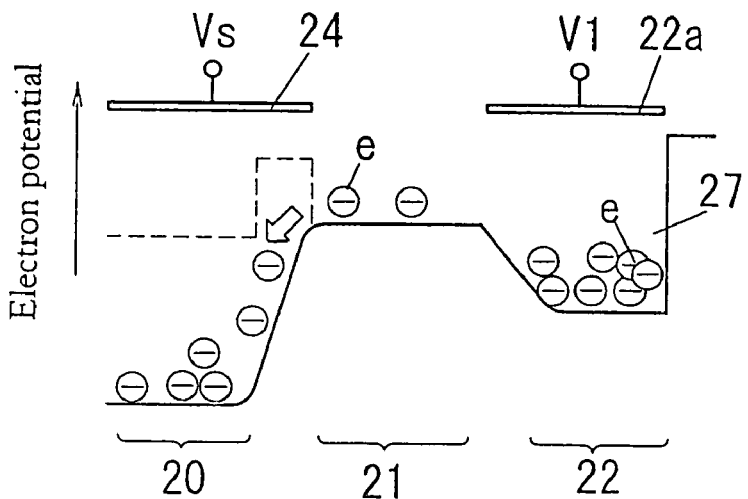
Figure 9C:
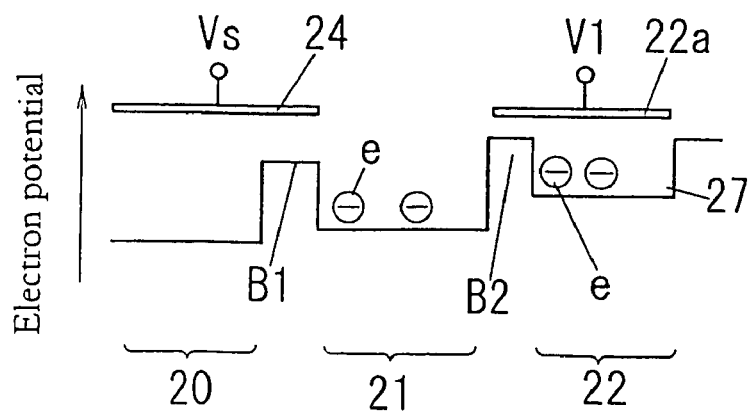

FIGS. 9A to 9C show relationships between applied voltages to the gate electrode 22a and the overflow electrode 24 and movements of the electric charges generated by the photodiode 21. In FIG. 9A, the potential barrier "B2" derived from the separation layer 35 is removed by applying a relatively high positive voltage to the gate electrode 22a, and the potential well 27 is formed in the storage transfer layer 34. At this time, a relatively low voltage is applied to the overflow electrode 24 to form the potential barrier "B1".

In this case, the electric charges generated by the photodiode 21 can not migrate to the substrate 20 by the presence of the potential barrier "B1". As a result, the electric charges can not be discarded. Therefore, all of the electric charges falling within the capacity range of the potential well 27 in the electric charges generated by the photodiode 21 migrates as the signal charges to the vertical transfer portion 22, as shown by the arrow in FIG. 9A.

On the other hand, in FIG. 9B, a relatively high positive voltage is applied to the gate electrode 22a, as shown in FIG. 9A, and also a relatively high positive voltage is applied to the overflow electrode 24. The voltage applied to the overflow electrode 24 is determined such that a potential of the substrate 20 is lower than the potential of the vertical transfer portion 22. Since the potential barrier "B1" derived from the p-well 31 is removed, a parts of the electric charges generated by the photodiode 21 can migrate as the signal charges to the vertical transfer portion 22, and the balance of the electric charges can be discarded as waste charges through the substrate 20, as shown by the arrow in FIG. 9B. In this case, the ratio of the signal charges relative to the electric charges generated by the photodiode 21 decreases as compared with the case of FIG. 9A. This means a reduction in the sensitivity The sensitivity that is a ratio of the signal charges to the waster charges is determined according to magnitude relations in the voltages applied to the gate electrode 22a and the overflow electrode 24. Therefore, larger amounts of the electric charges (electrons) migrate toward a region of lower potential. Since the electric charges of the vertical transfer portion 22 under the condition of FIG. 9A are stored in the potential well 27, they can not migrate to the substrate under the condition of FIG. 9B.

To read out the signal charges stored in the vertical transfer portion 22, as shown in FIG. 9C, the voltage applied to the gate electrode 22a is reduced to form the potential barrier "B2". The formation of the potential barrier "B2" prevents an inflow of the electric charges from the photodiode 21 to the vertical transfer portion 22, and an outflow of the electric charges from the vertical transfer portion 22 to the photodiode 21.

Under this condition, when 4-phase clocks "V1"~"V4" are provided to the gate electrodes 22a, 22b, and 2-phase clocks "VH1", "VH2" are provided to the gate electrodes 23a, 23b, it is possible to read out the signal charges stored in the vertical transfer portion 22. The signal charges stored in the vertical transfer portion 22 can be read out every determination of the respective integral (A0~A3) with respect to each of the above-described four intervals. For example, after the signal charges corresponding to the integral "A0" are stored in the potential well 27, they are read out. Next, after the signal charges corresponding to the integral "A1" are stored in the potential well 27, they are read out again. Thus, the procedure of storing and reading out the signal charges is repeated. It goes without saying that time periods of storing the integrals A0~A3 (i.e., the number of clock signals) are equally set to each other. In addition, the sequence of reading out the integrals A0~A3 is not limited to the above-described case. For example, after the integral A0 is determined, the integral A2 may be determined in place of the integral A1.

According to the present embodiment, since the voltage applied to the overflow electrode 24 is controlled, delay of response caused by capacity components is prevented as compared with the case of applying the voltages to the gate electrodes 22a, 22b formed at the vertical transfer portion 22. Therefore, it becomes possible to use a relatively high local oscillator frequency. This also means that a relatively high emission frequency can be used. As a result, it is possible to improve axial resolution by shortening the period of intensity modulation.

In the case of controlling the vertical-overflow drain, it is possible to control the voltage applied to the p-well 31 formed on the substrate 20 in place of controlling the voltage applied to the overflow electrode 24 formed on the substrate 20. This is ditto for another embodiments described in the present specification.

In addition, the sensitivity may be controlled by the gate electrodes 22a, 22b under a condition that the potential barrier "B1" has been removed by applying a high voltage to the overflow electrode 24. That is, when there is the potential barrier "B2", the electric charges of the photodiode 21 migrate toward the overflow drain 20. On the other hand, under the condition that the potential barrier "B2" has been removed, the electric charges of the photodiode 21 mainly migrate toward the vertical transfer portion 22. Therefore, it is possible to control the amounts of electric charges migrating from the photodiode 21 to the vertical transfer portion 22. Other configuration and performance are similar to the second embodiment.

(Fourth Embodiment)

A distance measuring device of this embodiment is substantially the same as that of the third embodiment other then the following features. That is, a ratio of the amounts of electric charges supplied as the signal charges to the storage transfer layer 34 relative to the amounts of electric charges generated by the photodiode 21 can be determined by controlling both of the voltages applied to the gate electrode 22a and the overflow electrode 24.

Figure 10A:
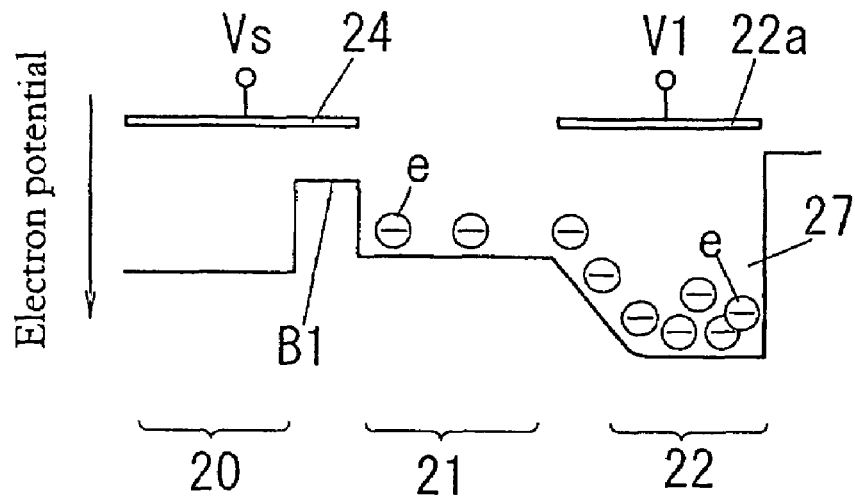
FIGS. 10A and 10B are explanatory diagrams illustrating the principle of operation of a distance measuring device according to a fourth embodiment of the invention.

In FIG. 10A, a potential barrier "B2" derived from the separation layer 35 is removed by applying a relatively high positive voltage to the gate electrode 22a, and a potential well 27 is formed in the storage transfer layer 34. At this time, a relatively low voltage is applied to the overflow electrode 24 to form a potential barrier "B1". In this case, the electric charges (electrons "e") generated by the photodiode 21 can not migrate to the substrate 20 by the presence of the potential barrier "B1". Therefore, waste charges do not occur. All of the electric charges falling within the capacity range of the potential well 27 in the electric charges generated by the photodiode 21 migrate as the signal charges to the vertical transfer portion 22, as shown by the arrow in FIG. 10A.

Figure 10B:
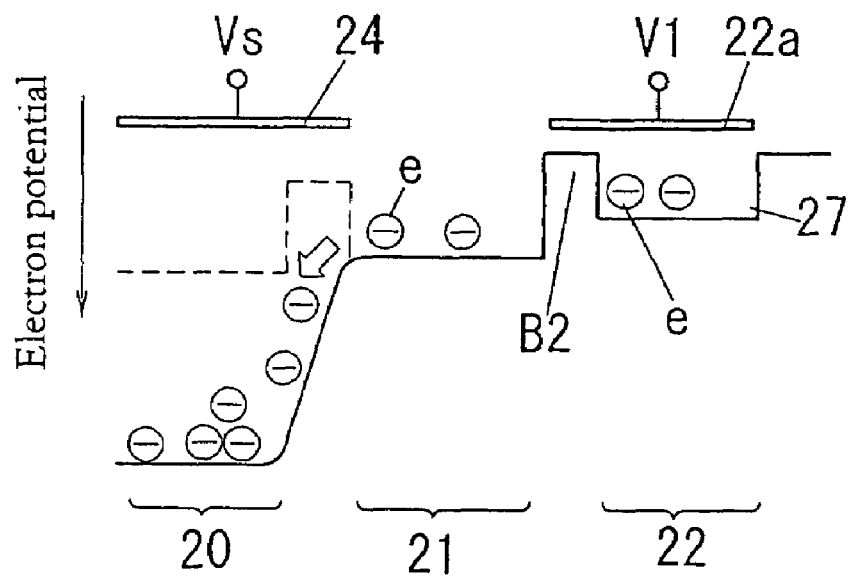

On the other hand, in FIG. 10B, a relatively low positive voltage is applied to the gate electrode 22a, as shown in FIG. 10A, and a relatively high positive voltage is applied to the overflow electrode 24. The voltage applied to the overflow electrode 24 is determined such that a potential of the substrate 20 is lower than the potential of the vertical transfer portion 22. In this case, the potential barrier "B1" derived from the p-well 31 is removed. However, since the potential barrier "B2" derived from the separation layer 35 is formed, most of electric charges generated by the photodiode 21 are discarded as the waste charges through the substrate 20, as shown by the arrow in FIG. 10B. As a result, the ratio of the signal charges relative to the electric charges generated by the photodiode 21 decreases as compared with the case of FIG. 10A. This means a reduction in the sensitivity.

In the present embodiment, the conditions of FIGS. 10A and 10B are alternately repeated. The sensitivity that is a ratio of the signal charges to the waster charges is determined according to magnitude relations in the voltages applied to the gate electrode 22a and the overflow electrode 24 and a ratio of the time period of applying the voltage to the gate electrode 22a and the time period of applying the voltage to the overflow electrode 24. Other configuration and performance are similar to the second embodiment.

(Fifth Embodiment)

Figure 11:
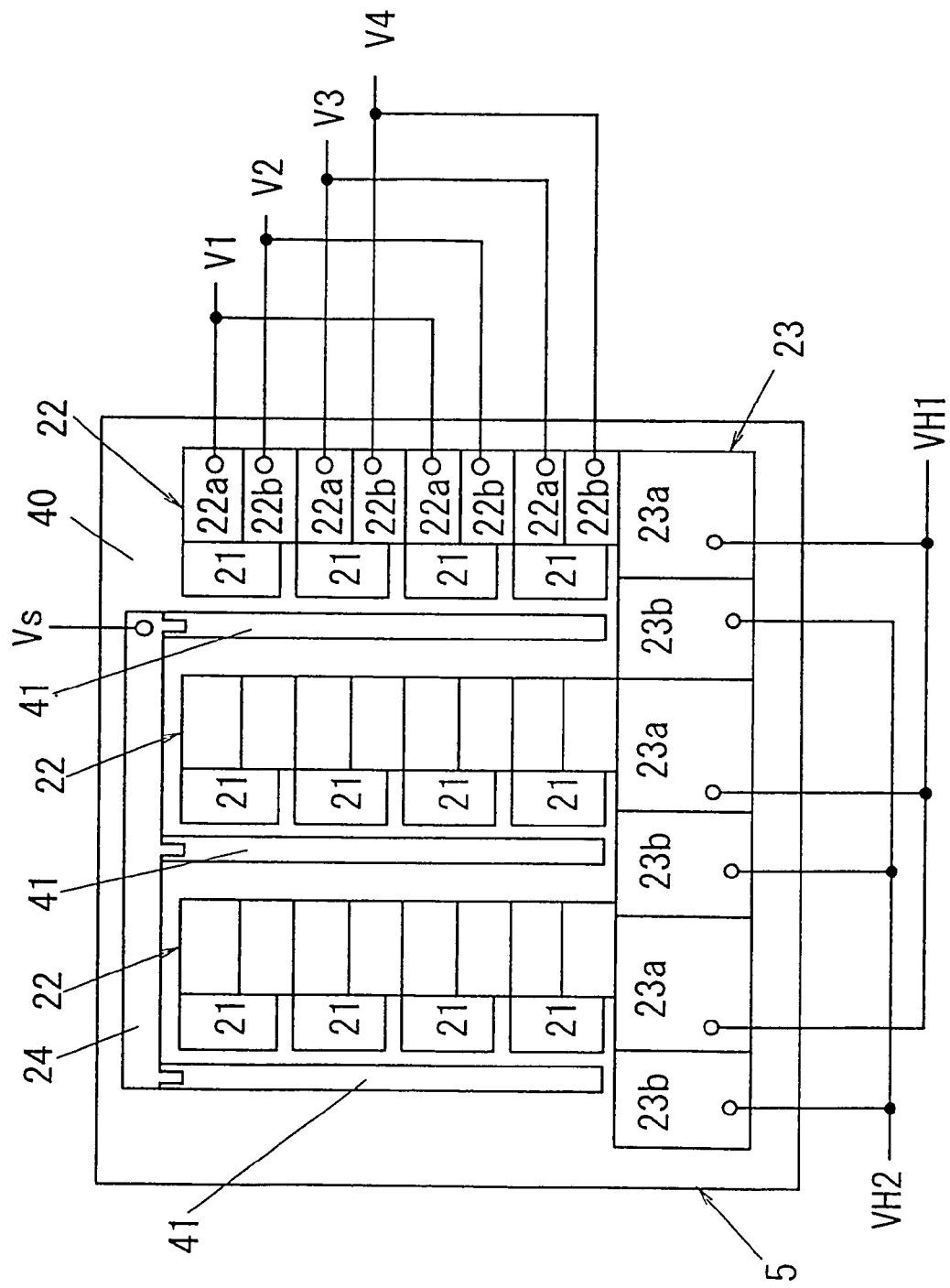
FIG. 11 is a plan view of an image sensor for a distance measuring device according to a fifth embodiment of the invention.

In this embodiment, an interline transfer CCD having a lateral overflow drain is used as the image sensor 5. As this type of image sensor, it is possible to use one available in the market. As shown in FIG. 11, in the image sensor 5 of this embodiment, an overflow drain 41 of n-type semiconductor is formed adjacent to each of columns of a matrix arrangement (3×4) of the photodiodes 21. In this case, the image sensor 5 has three overflow drains 41. The overflow drains 41 are connected at their upper ends to each other by an overflow electrode 24 that is an aluminum electrode. The vertical transfer portion 22 and the horizontal transfer portion 23 have the similar functions to them of the image sensor 5 of the third embodiment.

Figure 12:
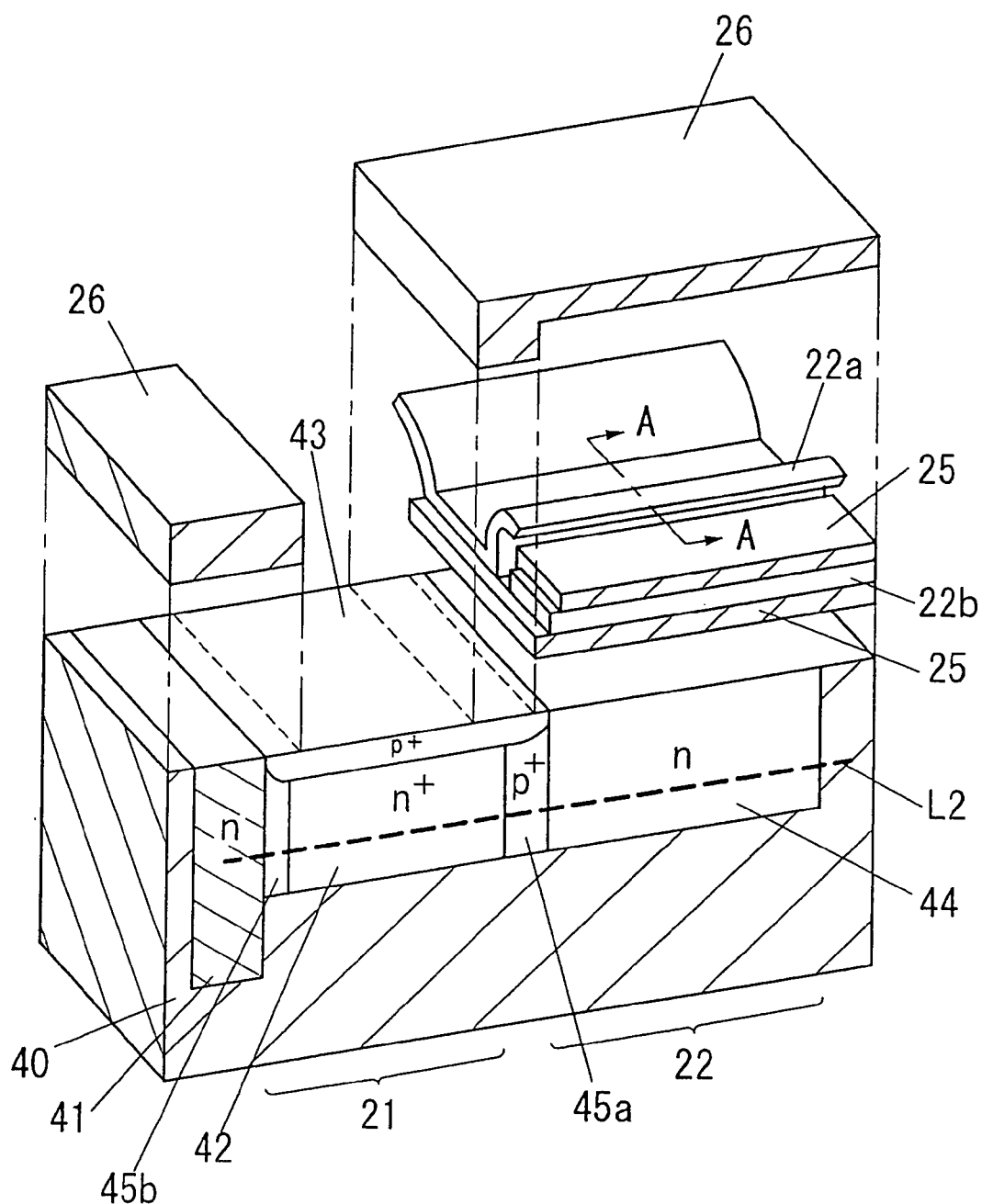
FIG. 12 is an exploded perspective view of a relevant portion of the image sensor.

Referring to FIG. 12, the image sensor 5 is more specifically explained. In the present embodiment, a p-type semiconductor substrate is used as the substrate 40. An n$^+$-type semiconductor layer 42 is formed on a general surface of the substrate 40 over a region, at which the formation of the photodiode 21 is intended. Therefore, the photodiode 21 is composed of the n$^+$-type semiconductor layer 32 and the substrate 40. On the other hand, a storage transfer layer 44 of n-type semiconductor is formed on a general surface of the substrate 40 over a region, at which the formation of the vertical transfer portion 22 is intended.

A separation layer 45a of p$^+$-type semiconductor is formed between the n$^+$-type semiconductor layer 42 and the storage transfer layer 44. A separation layer 45b of p$^+$-type semiconductor is formed between the n$^+$-type semiconductor layer 42 and the overflow drain 41. The numeral 43 designates a p$^+$-type semiconductor surface layer having the same impurity concentration as the separation layers 45a, 45b, which is formed on the n$^+$-type semiconductor layer 42 and the separation layers 45a, 45b. This surface layer 43 prevents that the electric charges generated by the photodiode 21 migrate to the vertical transfer portion 22 through the surface of the n$^+$-type semiconductor layer 42.

The top surface of the storage transfer layer 44 is substantially flush with the top surfaces of the surface layer 43 and the overflow drain 41. In addition, a thickness of the overflow drain 41 is larger than the thickness of the $n^+$-type semiconductor layer 42. Gate electrodes 22a, 22b are formed every photodiode 21 on the storage transfer layer 44 through an insulating film 25. One of the gate electrodes 22a, 22b has a larger width than the other one. In addition, the surface of the image sensor 5 other than areas for allowing the photodiodes 21 to receive the light is covered with a light shielding film 26. These structures are similar to the image sensor 5 of the third embodiment.

Figure 13:
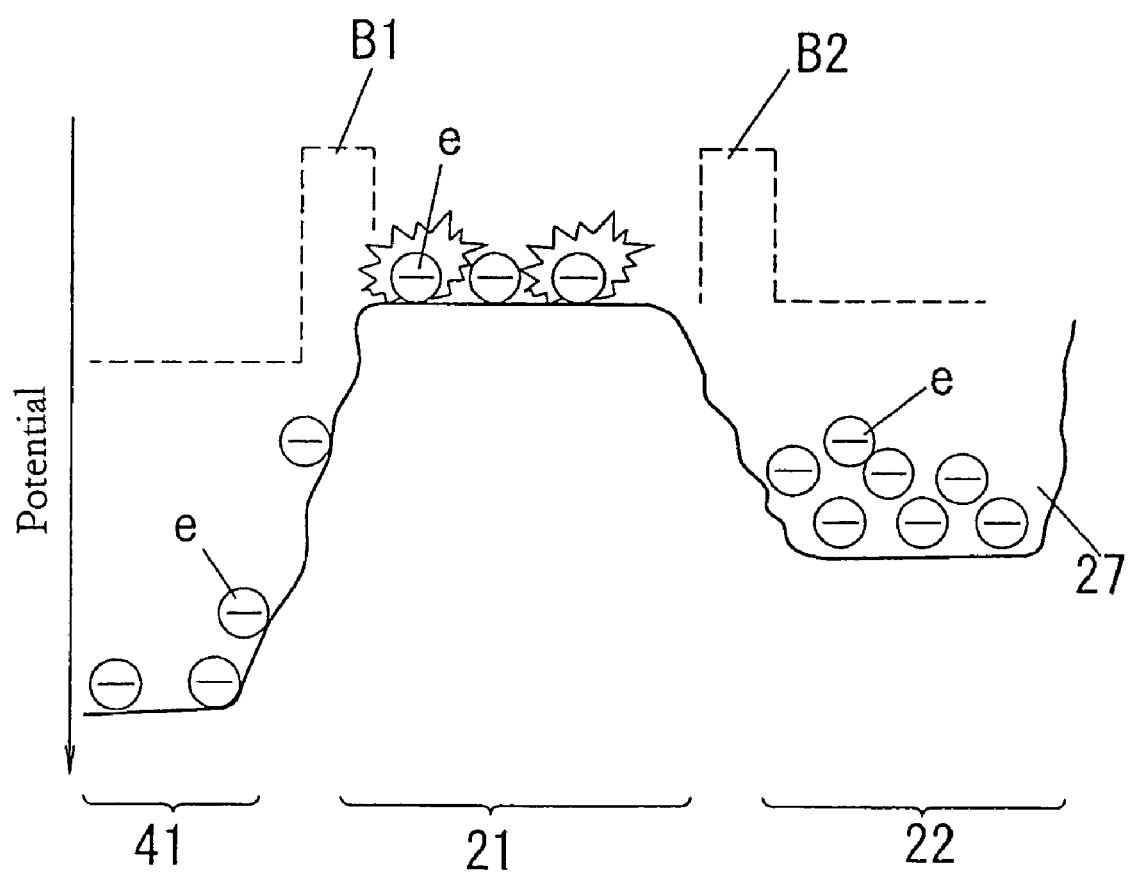
FIG. 13 is an explanatory diagram illustrating the principle of operation of the distance measuring device.
Figure 14A:
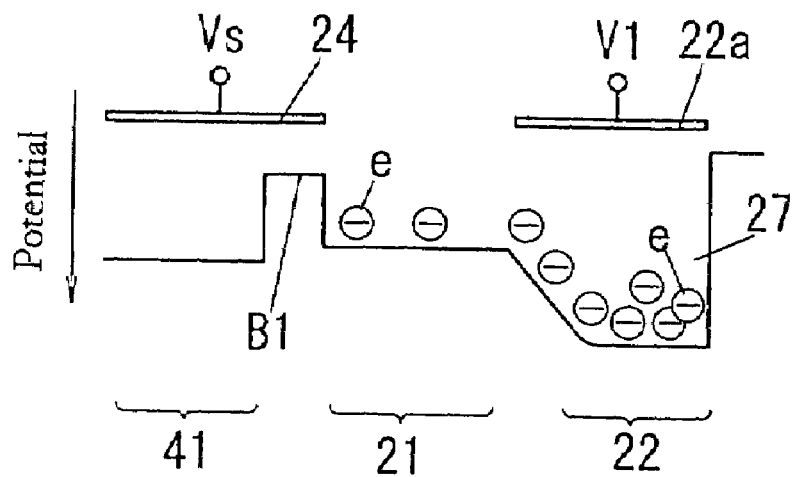
FIGS. 14A to 14C are explanatory diagrams illustrating the principle of operation of the distance measuring device.
Figure 14B:
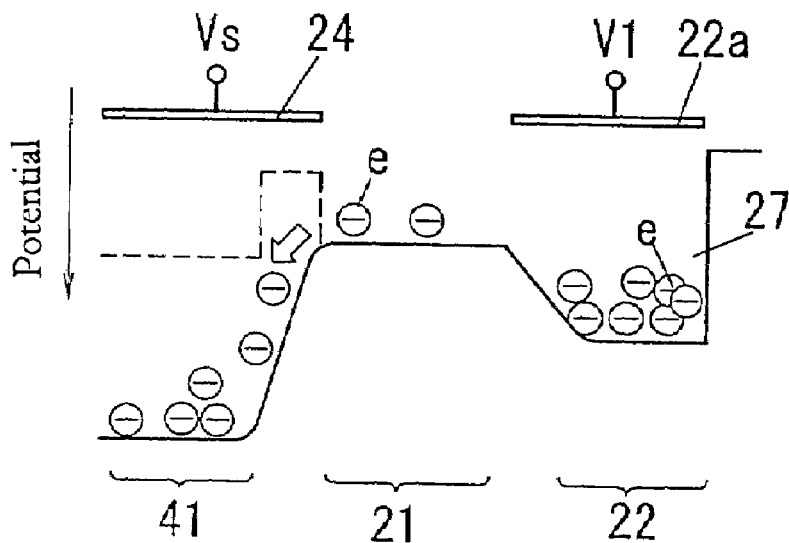
Figure 14C:
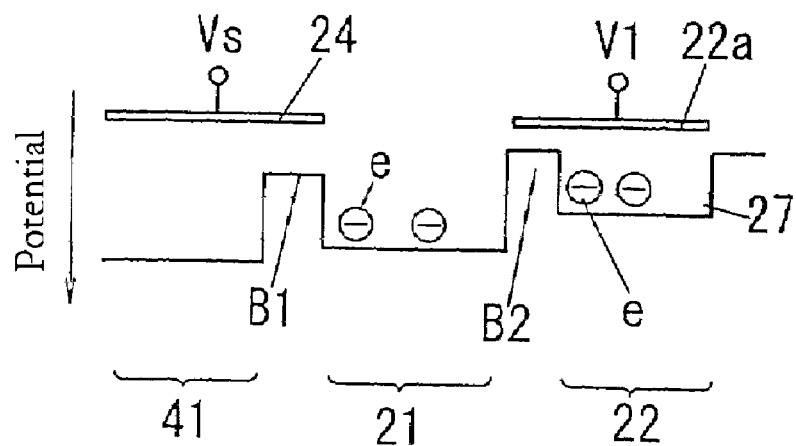

As understood from comparisons of FIG. 13 showing a change in electron potential along the dotted line in FIG. 12 and FIGS. 14A to 14C with FIGS. 8 and 9A to 9C, the present embodiment is different from the third embodiment only in that the electric charges generated by the photodiode 21 are discarded through the overflow drain 41 in place of the substrate 20 of the third embodiment. As compared with the $n^+$-type semiconductor layer 32 constructing the photodiode 21 of the interline transfer CCD having the vertical overflow drain of the third embodiment, the photodiode 21 of the interline transfer CCD having the lateral overflow drain of the present embodiment can use the $n^+$-type semiconductor layer 42 having a larger thickness.

That is, in the case of forming the vertical overflow drain, it is needed to form the photodiode 21 on the substrate 20. However, in the case of forming the lateral-overflow drain, since the substrate 40 is used as the semiconductor layer constructing the photodiode 21, it becomes possible to increase the thickness of the $n^+$-type semiconductor layer 42. As a result, the light receiving area decreases because the overflow drain 41 is formed adjacent to the photodiode 21. However, there is an advantage that the sensitivity to infrared is improved as compared with the third embodiment. Other configuration and performance are similar to the third embodiment.

(Sixth Embodiment)

In this embodiment, a frame transfer CCD having a vertical overflow drain is used as the image sensor 5. As this type of image sensor, it is possible to use one available in the market.

Figure 15:
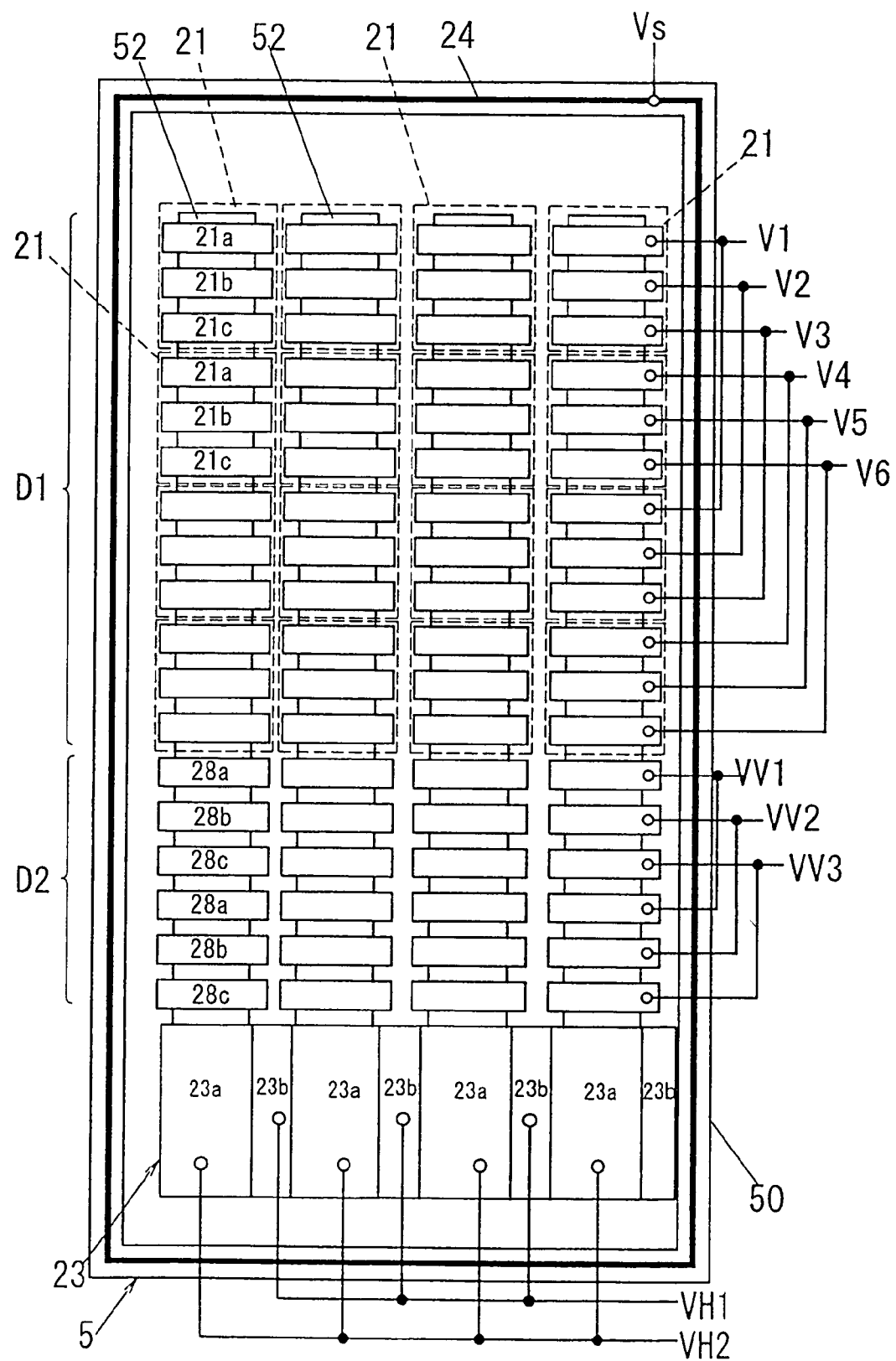
FIG. 15 is a plan view of an image sensor for a distance measuring device according to a sixth embodiment of the invention.

As shown in FIG. 15, the image sensor 5 of this embodiment is a 2-dimensional image sensor having a matrix (4×4) arrangement of photodiodes 21. This image sensor 5 is provided with an image pickup portion "D1" for allowing the photodiodes 21 aligned in the vertical direction to function as vertical transfer CCD, and a storage portion "D2" formed adjacent to the image pickup portion "D1", which is an arrangement of vertical transfer CCD not having the capability of photoelectric conversion. In FIG. 15, the numeral 23 designates a horizontal transfer portion formed adjacent to the storage portion "D2", which is formed by horizontal transfer CCD. The horizontal transfer portion functions as an electric charge ejector.

In this embodiment, the photodiode 21 and the vertical transfer CCD have the function of storing electric charges and transferring the electric charges in the vertical direction. Therefore, the image pickup portion "D1" and the storage portion "D2" function as the electric charge storage. Each of the columns of the matrix arrangement of the image pickup portion "D1" has four photodiodes 21, each of which is formed at the light receiving surface with three gate electrodes 21a~21c aligned in the vertical direction. Each of the columns of the vertical transfer CCD in the storage portion "D2" has two sets of three gate electrodes 28a~28c. In addition, as in the case of the third embodiment, the horizontal transfer portion 23 has a pair of gate electrodes 23a, 23b every column of the storage portion "D2".

The gate electrodes 21a~21c are driven by a 6-phase clock "V1"~"V6", and the gate electrodes 28a~28c are driven by a 3-phase clock "VV1"~"VV3". The gate electrodes 23a, 23b are driven by a 2-phase clock "VH1", "VH2". The horizontal transfer portion 23 outputs the signal charges from the storage portion "D2" every one horizontal line. Since this type of driving technique is well known in the field of CCD, the detailed explanation is omitted.

The image pickup portion "D1", the storage portion "D2" and the horizontal transfer portion 23 are formed on a single substrate 50. An overflow electrode 24 that is an aluminum electrode is formed directly on the substrate 50 not through an insulating film. That is, the substrate 50 functions as an overflow drain. The overflow drain electrode 24 is formed on the substrate 50 so as to surround the whole of the image pickup portion "D1", the storage portion "D2" and the horizontal transfer portion 23. The surface of the substrate 50 other than areas corresponding to the photodiodes 21 is covered with a light shielding film (not shown).

Figure 16:
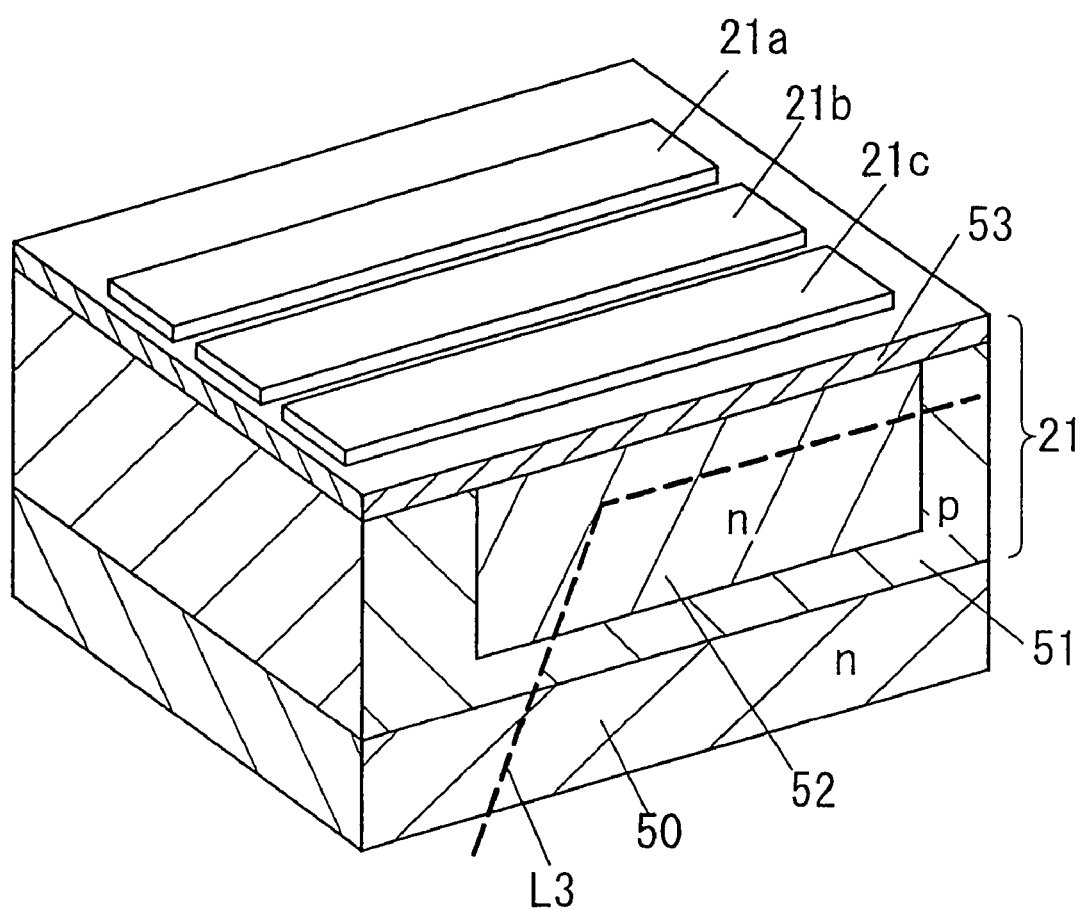
FIG. 16 is a perspective view of a relevant portion of the image sensor.

Referring to FIG. 16, the image sensor 5 is more specifically explained. In the present embodiment, an n-type semiconductor substrate is used as the substrate 50. A p-type semiconductor layer 51 is formed on a general surface of the substrate 50 over a region, at which the formation of the photodiode 21 is intended. In addition, an n-well 52 of n-type semiconductor is formed in the p-type semiconductor layer 51.

The p-n junction provided by the p-type semiconductor layer 51 and the n-well 52 provides the photodiode 21. In addition, as shown in FIG. 16, the three gate electrodes 21a~21c are formed on top surfaces of the p-type semiconductor layer 51 and the n-well 52 through an insulating film 53 of silicon dioxide. Each of the gate electrodes 21a~21c is made of polysilicon.

The n-well 52 is continuously formed over the image pickup portion "D1" and the storage portion "D2". That is, in the n-well 52 of the image pickup portion "D1" the electric charges are generated, stored and transferred, and in the n-well 52 of the storage portion "D2", the electric charges are stored and transferred.

Next, a mechanism of driving the image sensor 5 described above is explained. When the light provided from the space is incident on the photodiode 21, electric charges are generated by the photodiode 21. When suitable voltages are applied to the gate electrodes 21a~21c, a potential well is formed as the electric charge storage in the n-well 52. The generated electric charges can be stored in the potential well. In addition, since the depth of the potential well can be changed by controlling the voltages applied to the gate electrodes 21a~21c, it is possible to transfer the electric charges by controlling the depth of the potential well. That is, the gate electrodes 21a~21c function as the storage gates.

On the other hand, when a suitable voltage "Vs" is applied to the overflow electrode 24, the electric charges generated by the photodiode 21 are discarded through the substrate 50. Therefore, by controlling the voltage applied to the overflow electrode 24 and a time period of applying the voltage to the overflow electrode 24, it is possible to change a ratio of amounts of the electric charges stored as the signal charges in the potential well of the n-well 52 relative to the amounts of the electric charges generated by the photodiode 21. That is, by applying the voltage corresponding to the local oscillator signal to the overflow electrode 24 (i.e., the substrate 50), the ratio of the signal charges relative to the electric charges generated by the photodiode 21 can be controlled. Therefore, as in the case of the third embodiment, the substrate 50 functions as the sensitivity controller.

Figure 17:
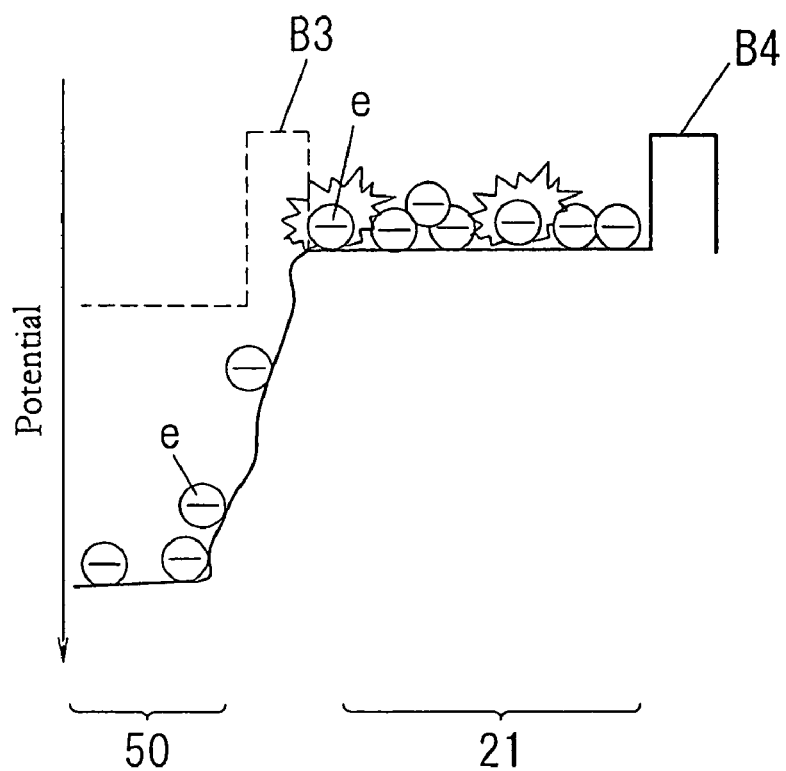
FIG. 17 is an explanatory diagram illustrating the principle of operation of the distance measuring device.

Referring to FIG. 17 showing an electron potential along the dotted line in FIG. 16, the migration of electric charges generated by the photodiode 21 is explained. The region designated by the numeral 21 in FIG. 17 corresponds to the photodiode. The region designated by the numeral 50 in FIG. 17 corresponds to the substrate. When no voltage is applied to the overflow electrode 24, a potential barrier "B3" derived from the p-type semiconductor layer 51 is formed between the photodiode 21 (n-well 52) and the substrate 50. On the other hand, at the side opposed to the substrate 50 of the photodiode 21, a potential barrier "B4" derived from the p-type semiconductor layer 51 is formed.

Figure 18:
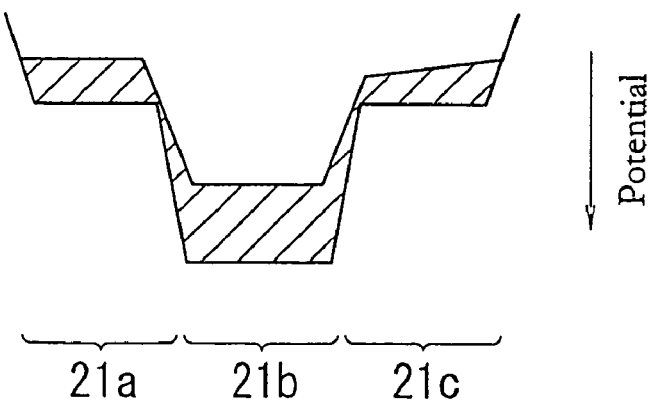
FIG. 18 is an explanatory diagram illustrating the principle of operation of the distance measuring device.

By the formation of these potential barriers, it is possible to prevent the leakage of electric charges (electrons "e") generated by the photodiode 21 to the outside. The height of the potential barrier "B3" can be determined by controlling the applied voltage to the overflow electrode 24. On the other hand, amounts of electric charges stored in the potential well formed by applying the voltages to the gate electrodes 21a~21c are determined by the depth of the potential well, which is determined by the applied voltages to the gate electrodes 21a~21c. That is, when the voltage applied to the gate electrode 21b is higher than the voltages applied to the gate electrodes 21a, 21c, the potential well is formed to have the maximum depth at its center region, as shown in FIG. 18.

Figure 19A:
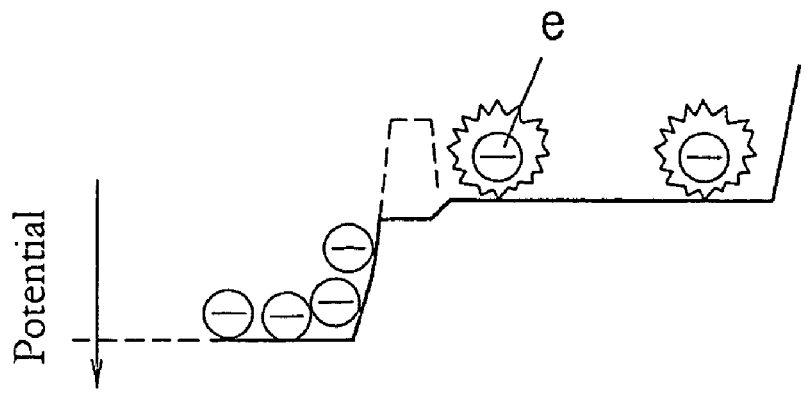
FIGS. 19A to 19C are explanatory diagram illustrating the principle of operation of the distance measuring device.
Figure 19B:
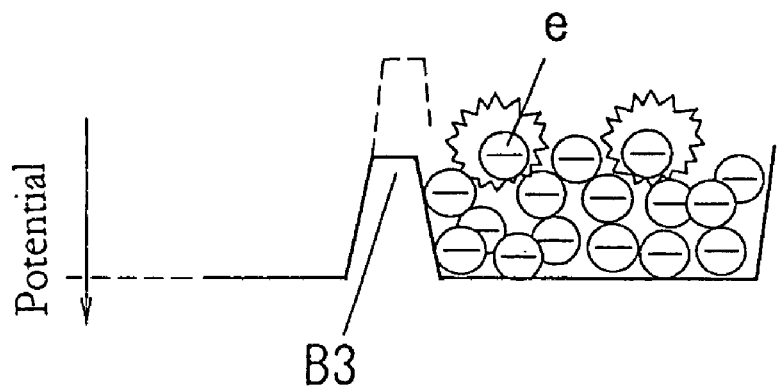
Figure 19C:
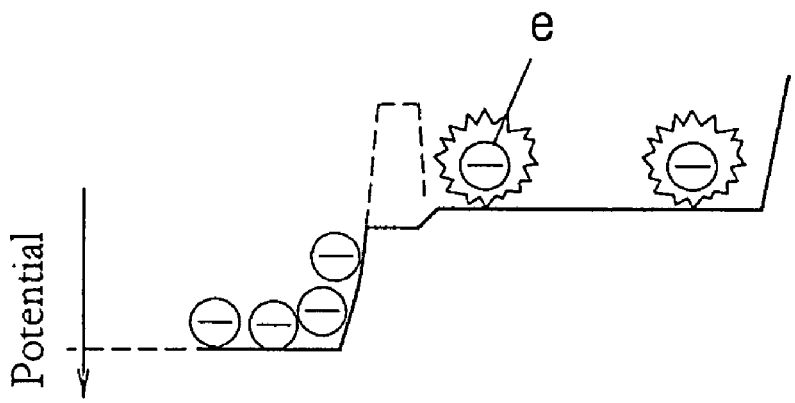

When a suitable voltage is applied to the overflow electrode 24 such that the potential of the substrate 50 is lower than the potential of the n-well 52, voltages are applied to the gate electrodes 21a, 21c to remove the potential barrier "B3", and a voltage is applied to the gate electrode 21b to form the potential barrier "B3", large amounts of electric charges (electrons "e") are stored at the center region, as shown in FIG. 19B, and the electric charges are discarded at the both side regions through the substrate 50, as shown in FIGS. 19A and 19C. Thus, it is possible to adjust the ratio of the signal charges stored in the potential well formed in the n-well 52 relative to the electric charges generated by the photodiode 21 by giving the local oscillator signal to the overflow electrode 24. That is, since the sensitivity is controlled by the local oscillator signal, the amounts of signal charges stored in the potential well become the amounts of electric charges corresponding to the integrals A0~A3 of a beat signal at the time defined by the 6-phase clock "V1"~"V6".

By the way, a part of electric charges generated at the side gate electrodes 21a, 21c flow into the potential well corresponding to the center gate electrode 21b as noise components during a time period over which the electric charges are generated by the photodiode 21. In addition, since the signal charges are transferred every determination of the respective integral A0 ~A3, the electric charges generated by the photodiode 21 are mixed in the integral A0~A3 as the noise components during the time period of transferring the signal charges. However, these noise components are averaged by integration, and substantially removed by subtraction performed to determine the phase difference "ψ". Therefore, the influence of those noise components becomes small. That is, it is possible to accurately determine the phase difference "ψ" even though the frame transfer CCD is used.

In addition, since an aperture ratio of the photodiode 21 can be increased by use of the frame transfer CCD, it is possible to achieve a higher sensitivity as compared with the case of using the interline CCD. In the above case, the three gate electrodes 21a~21c are provided every photodiode 21. However, the number of gate electrodes corresponding to one photodiode is not limited to this embodiment. Other configuration and performance are similar to the third embodiment.

(Seventh Embodiment)

Figure 20:
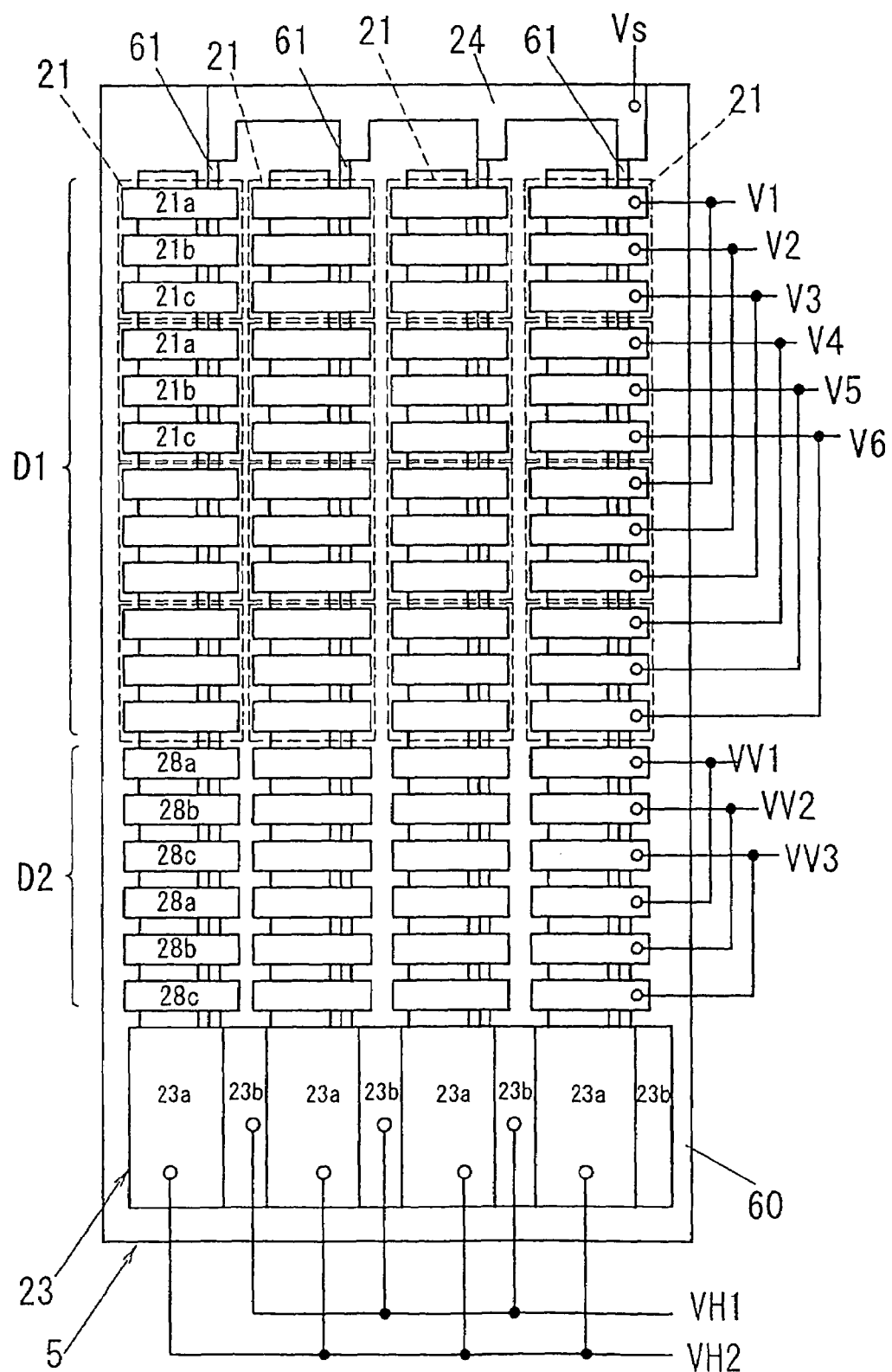
FIG. 20 is a plan view of an image sensor for a distance measuring device according to a seventh embodiment.

In this embodiment, a frame transfer CCD having a lateral overflow drain is used as the image sensor 5. As shown in FIG. 20, the image sensor 5 of this embodiment is a 2-dimensional image sensor having a matrix (4×4) arrangement of photodiodes 21. An overflow drain 61 of n-type semiconductor is formed adjacent to each of columns of the matrix arrangement of the photodiodes 21. In this case, the image sensor 5 has four overflow drains 61. The overflow drains 61 are connected at their upper ends to each other by an overflow electrode 24 that is an aluminum electrode. The image pickup portion "D1", the storage portion "D2" and the horizontal transfer portion 23 have the similar functions to them of the image sensor 5 of the sixth embodiment.

Figure 21:
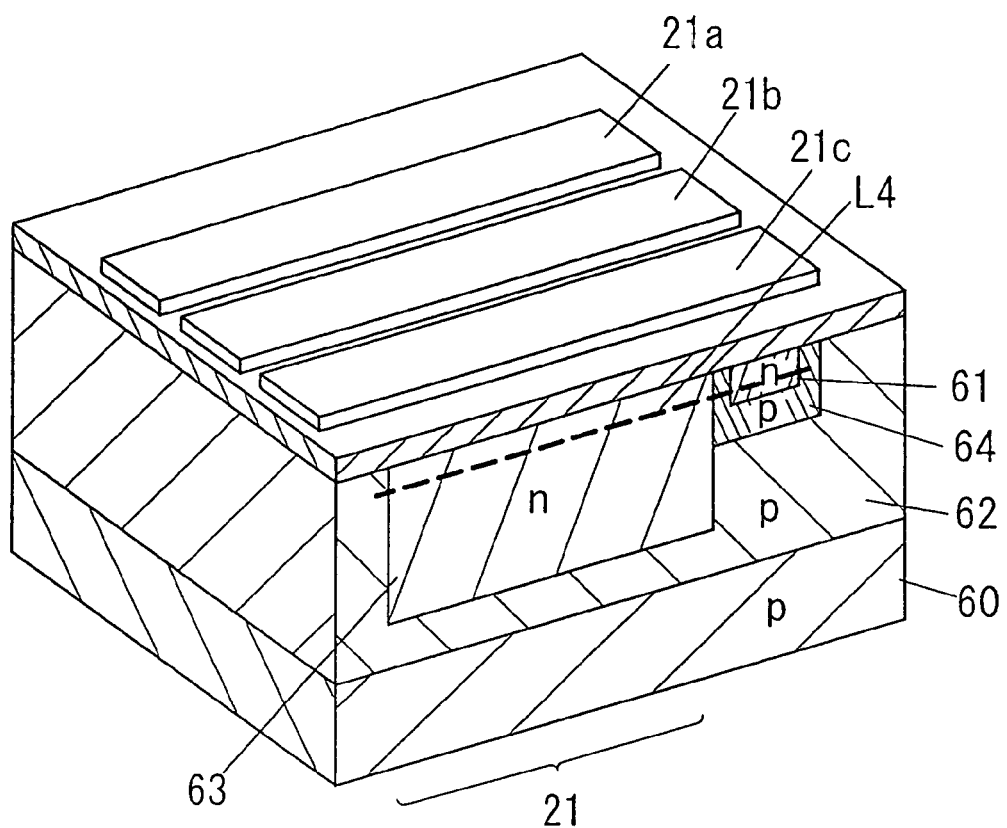
FIG. 21 is a perspective view of a relevant portion of the image sensor.

Referring to FIG. 21, the image sensor 5 is more specifically explained. In the present embodiment, a p-type semiconductor substrate is used as the substrate 60. A p-type semiconductor layer 62 is formed on a general surface of the substrate 60. In addition, an n-well 63 of n-type semiconductor is formed in the p-type semiconductor layer 62. The p-type semiconductor layer 62 and the n-well 63 provide the photodiode 21. A $p^+$-well 64 of $p^+$-type semiconductor is formed adjacent to the n-well 63 in the p-type semiconductor layer 62. The overflow drain 61 of n-type semiconductor is formed in a top surface of the $p^+$-well 64. Thus, the image sensor 5 of this embodiment has basically same structure as the image sensor of the sixth embodiment except for using the substrate 60 having a different conductivity type and forming the overflow drain 61. However, there is an advantage that the image sensor of this embodiment has a higher sensitivity to infrared, as compared with the sixth embodiment.

Figure 22:
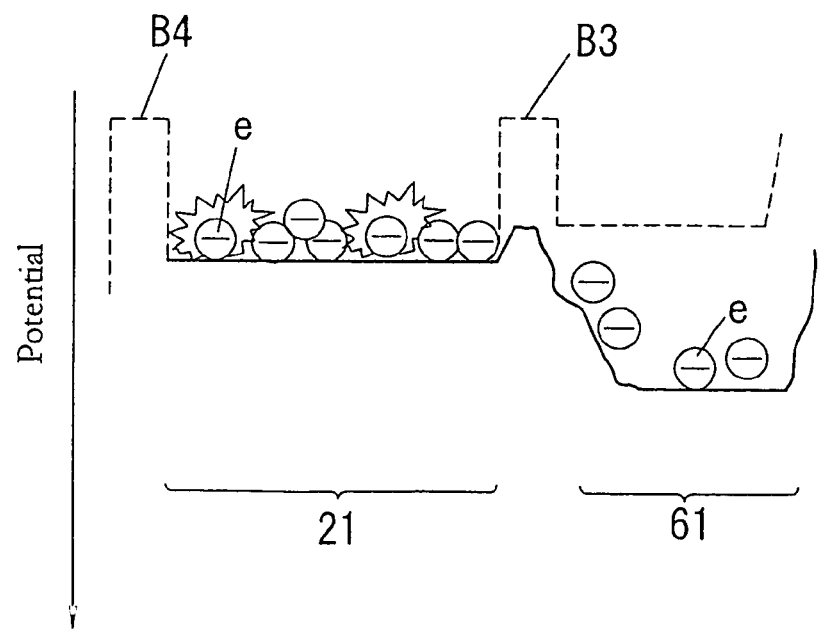
FIG. 22 is an explanatory diagram illustrating the principle of operation of the distance measuring device.

As understood from the comparison of FIG. 22 showing a change in electron potential along the dotted line L4 of FIG. 21 with FIG. 17, the present embodiment is different from the sixth embodiment in that the electric charges generated by the photodiode 21 are discarded through the overflow drain 61 in place of the substrate 50 of the sixth embodiment. Amounts of electric charges stored in a potential well formed in the n-well 63 by applying voltages to gate electrodes 21a~21c are determined by the depth of the potential well, which is determined by the applied voltages to the gate electrodes 21a~21c. That is, when the voltage applied to the gate electrode 21b is higher than the voltages applied to the gate electrodes 21a, 21c, the potential well corresponding to the center gate electrode 21b has the maximum depth.

Figure 23A:
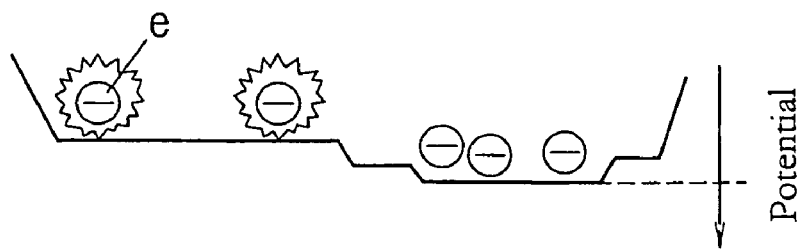
FIGS. 23A to 23C are explanatory diagram illustrating the principle of operation of the distance measuring device.
Figure 23B:
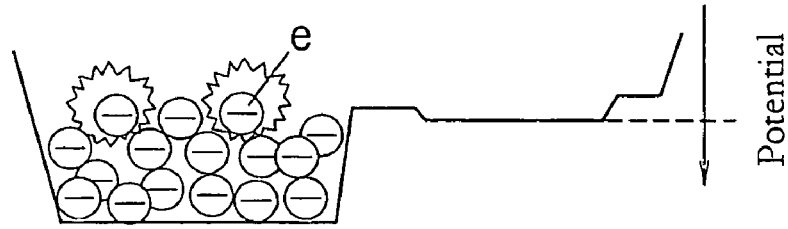
Figure 23C:
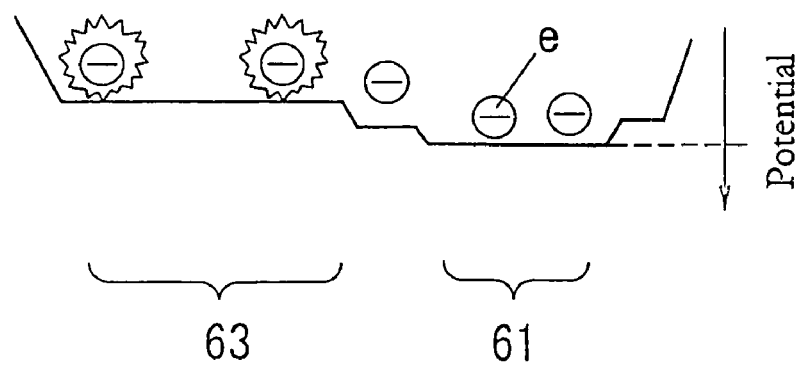

When a suitable voltage is applied to the overflow electrode 24 to lower the potential barrier "B3", electric charges (electrons "e") are stored at the potential well corresponding to the center gate electrode 21b, as shown in FIG. 23B, and electric charges generated at the regions corresponding to the side gate electrodes 21a, 21c are discarded through the overflow drain 61, as shown in FIGS. 23A and 23C. Other configuration and performance are similar to the sixth embodiment.

(Eighth Embodiment)

As explained in the sixth and seventh embodiments, when using the frame transfer CCD as the image sensor 5, the number of gate electrodes formed every photodiode 21 is not limited to three. In this embodiment, four gate electrodes are formed every photodiode 21.

Figure 24A:
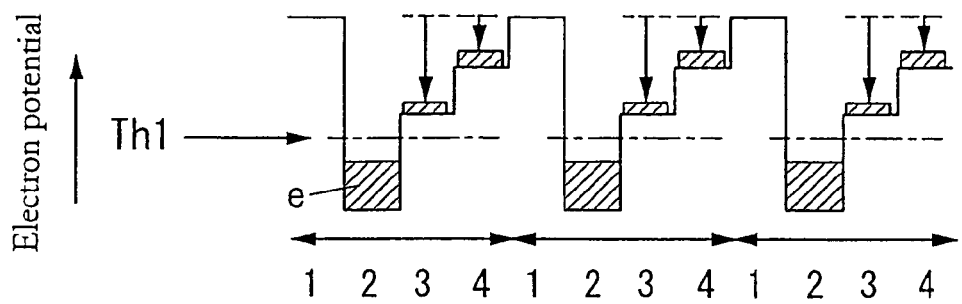
FIGS. 24A and 24B are explanatory diagram illustrating the principle of operation of a distance measuring device according to an eighth embodiment of the invention.
Figure 24B:
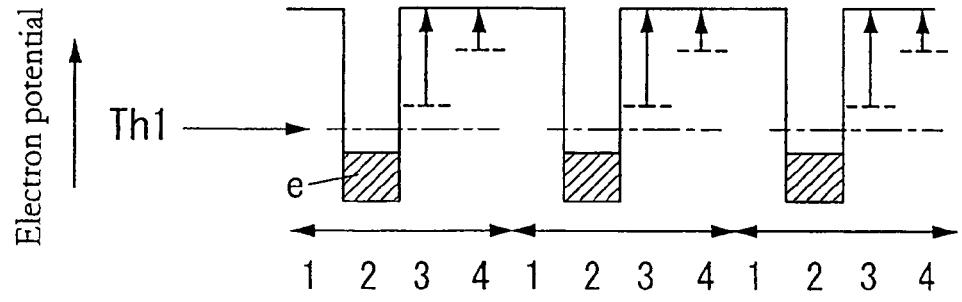

In FIGS. 24A and 24B, the numerals 1~4 respectively designate first, second, third and fourth gate electrodes. One cycle period of the numerals 1~4 corresponds to a region of one photodiode 21. FIG. 24A shows a period of storing electric charges generated by the photodiode 21, and FIG. 24B shows a period of discarding unnecessary charges. A threshold value "Th1" designates a potential of overflow drain.

As shown in FIG. 24A, in the period of storing the electric charges, a potential barrier is formed between adjacent photodiodes 21 by not applying a voltage to the first gate electrode (1) in order to prevent that that electric charges generated by each of the photodiodes 21 are mixed to each other. In addition, when voltages applied to the second, third and the fourth gate electrodes (2)~(4) are reduced in a stepwise manner, it is possible to obtain step-like potential wells having different depths. Each of regions corresponding to the third and fourth gate electrodes (3), (4) has a potential higher than the threshold value "Th1". At a region corresponding to the second gate electrode (2), the potential well has the maximum depth (the lowest potential). Since this potential is lower than the threshold value "Th1", electric charges (electrons "e") generated by the photodiode 21 are mainly stored in the region corresponding to the second gate electrode (2).

On the other hand, as shown in FIG. 24B, in the period of discarding the electric charges, potentials of the regions corresponding to the third and fourth gate electrodes (3), (4) are increased to prevent leakage of electric charges stored in the region corresponding to the second gate electrode (2) that has the lowest potential in the period of storing the electric charges. Thereby, electric charges generated at the regions corresponding to the first, third and the fourth gate electrodes (1), (3), (4) in the period of storing the electric charges flow into the overflow drain and the region corresponding to the second gate electrode (2). Therefore, it is possible to adjust a ratio of amounts of waste charges relative to the amounts of electric charges generated by the photodiode 21 by appropriately controlling a ratio of the period of storing the electric charges to the period of discarding the electric charges. This means that the sensitivity is adjustable. Other configuration and performance are similar to the sixth or seventh embodiment.

(Ninth Embodiment)

Figure 25A:
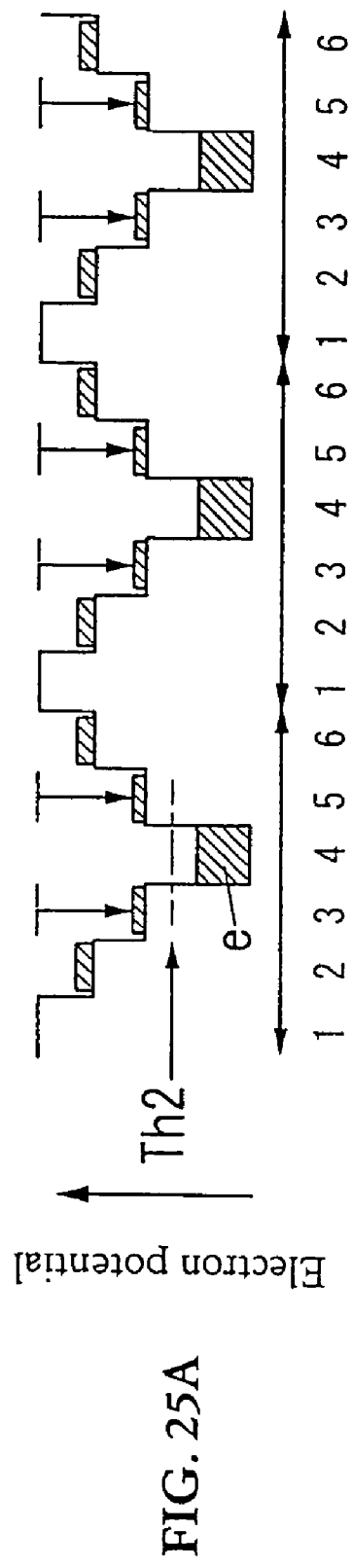
FIGS. 25A and 25B are explanatory diagram illustrating the principle of operation of a distance measuring device according to a ninth embodiment of the invention.
Figure 25B:
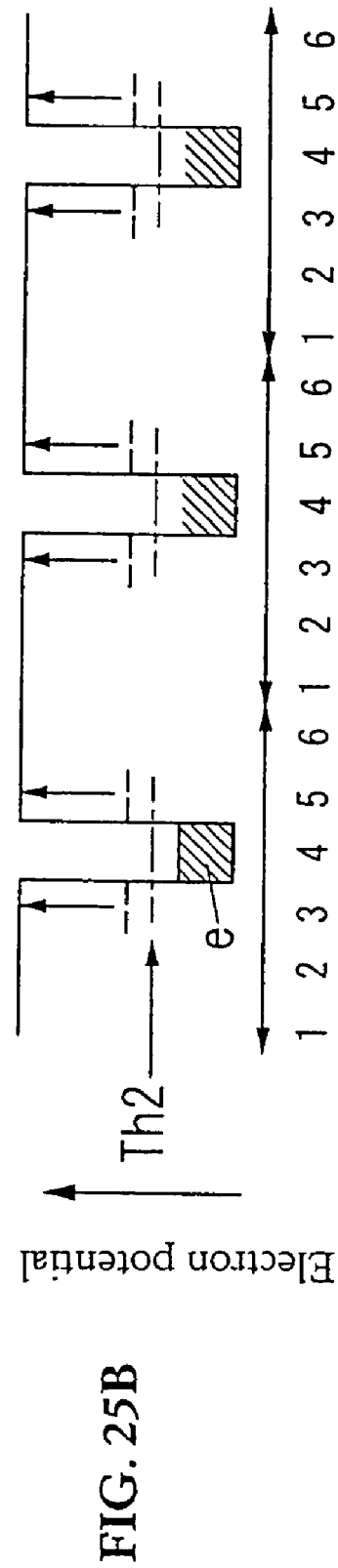

In this embodiment, six gate electrodes are formed every photodiode 21. In FIGS. 25A and 25B, the numerals 1~6 respectively designate first, second, third, fourth, fifth and sixth gate electrodes. One cycle period of the numerals 1~6 corresponds to a region of one photodiode 21. FIG. 25A shows a period of storing electric charges generated by the photodiode 21, and FIG. 25B shows a period of discarding unnecessary charges. A threshold value "Th2" designates a potential of overflow drain.

As shown in FIG. 25A, in the period of storing the electric charges, a potential barrier is formed between adjacent photodiodes 21 by not applying a voltage to the first gate electrode (1) in order to prevent that that electric charges generated by each of the photodiodes 21 are mixed to each other. At a region corresponding to the fourth gate electrode (4), the potential well has the maximum depth. Potentials of regions corresponding to the second, third, fifth and the sixth gate electrodes (2), (3), (5), (6) are increased in a stepwise manner so as to be higher than the threshold value "Th2". As described above, at the region corresponding to the fourth gate electrode (4), since the potential well has the maximum depth, which is lower than the threshold value "Th2", electric charges (electrons "e") generated by the photodiode 21 are mainly stored in the region corresponding to the fourth gate electrode (4).

As shown in FIG. 25B, in the period of discarding the electric charges, potentials of the regions corresponding to the second, third, fifth and sixth gate electrodes (2), (3), (5), (6) are increased to prevent leakage of electric charges stored in the region corresponding to the fourth gate electrode (4) that has the lowest potential in the period of storing the electric charges. Thereby, electric charges generated at the regions corresponding to the first, second, third, fifth and sixth gate electrodes (1), (2), (3), (5), (6) in the period of storing the electric charges flow into the overflow drain and the region corresponding to the fourth gate electrode (4).

Therefore, as in the case of the eighth embodiment, it is possible to adjust a ratio of amounts of waste charges relative to the amounts of electric charges generated by the photodiode 21 by appropriately controlling a ratio of the period of storing the electric charges to the period of discarding the electric charges. This means that the sensitivity is adjustable. Other configuration and performance are similar to the sixth or seventh embodiment.

(Tenth Embodiment)

As described above, when using the frame transfer CCD as the image sensor 5, electric charges generated by the photodiode 21 in a time period other than the periods of determining the integrals A0~A3 may be mixed as the noise components into the signal charges. The noise components are substantially constant, and averaged by storing the electric charges within the periods of determining the integrals A0~A3. Therefore, it is possible to remove the noise components to some extent and determine the phase difference "ψ".

However, the S/N ratio reduces due to the noise components. For example, when a larger dynamic range is needed at regions relating to storing or transferring of the electric charges, the cost/performance of the distance measuring device deteriorates. In the present embodiment, as shown in FIGS. 26A and 26B, a light-shielding film 65 is formed on the region of storing signal charges, and the region not relating to the generation of electric charges of the photodiode 21.

In FIGS. 26A and 26B, as in the case of the ninth embodiment, six gate electrodes (1) to (6) are formed every photodiode 21. Specifically, the light-shielding film 65 is formed at the regions corresponding to the gate electrodes (1), (3)~(5), so that electric charges (electrons "e") are generated only at the regions corresponding to the gate electrodes (2), (6) of the photodiode 21. As a result, the gate electrode (4) does not substantially contribute the generation of electric charges. In other words, the noise components do not occur at the gate electrode (4). As compared with the case of not forming the light-shielding film 65, it is possible to improve the S/N ratio. Other configuration and performance are similar to the ninth embodiment.

In the above-explained embodiments, electric charges are output every determination of the respective integral A0~A3. An image sensor 5 explained below has the capability of simultaneously determining at least two of the integrals A0~A3.

(Eleventh Embodiment)

Figure 27:
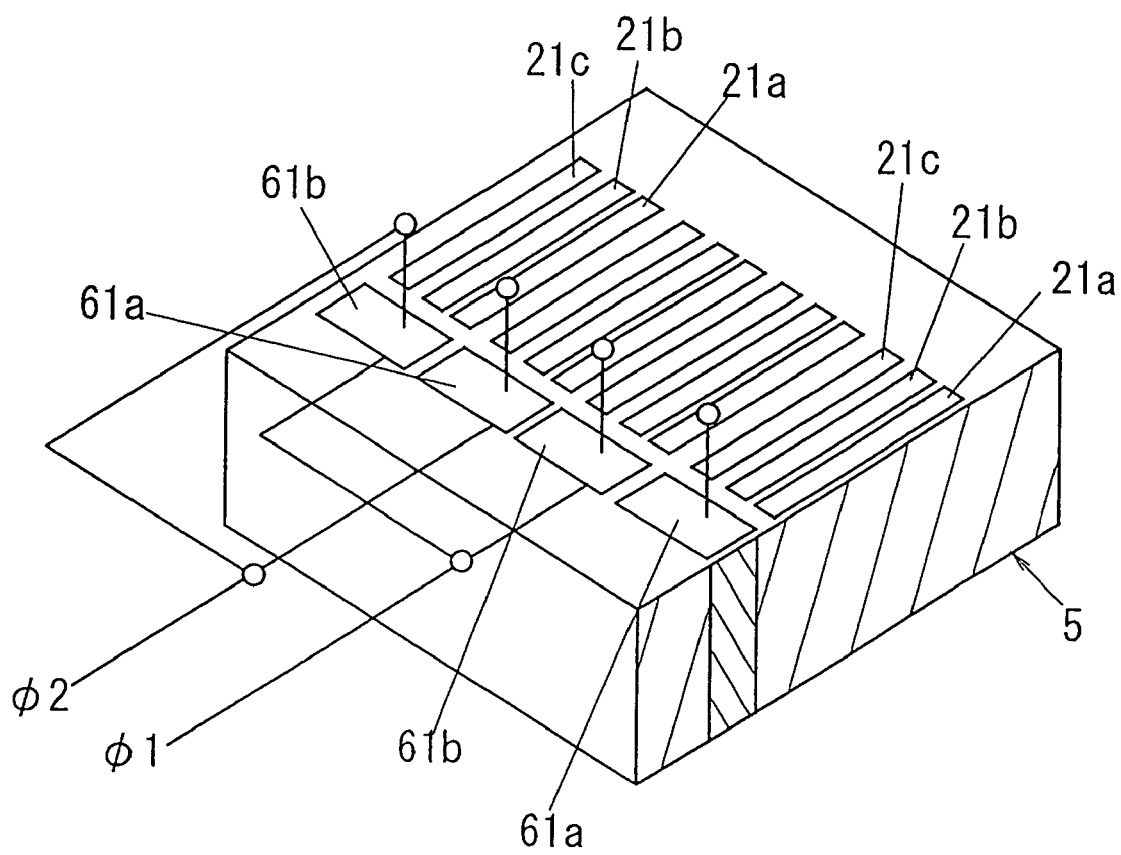
FIG. 27 is a perspective view of a distance measuring device according to an eleventh embodiment of the invention.

In this embodiment, a modification of the frame transfer CCD shown in FIG. 20 is used as the image sensor 5. That is, as shown in FIG. 27, overflow drains (61a, 61b) are alternately disposed such that each of the overflow drains is provided every photodiode 21. Therefore, it is needless to say that electric charges generated by each of the photodiodes 21 can be separately discarded.

Figure 28A:
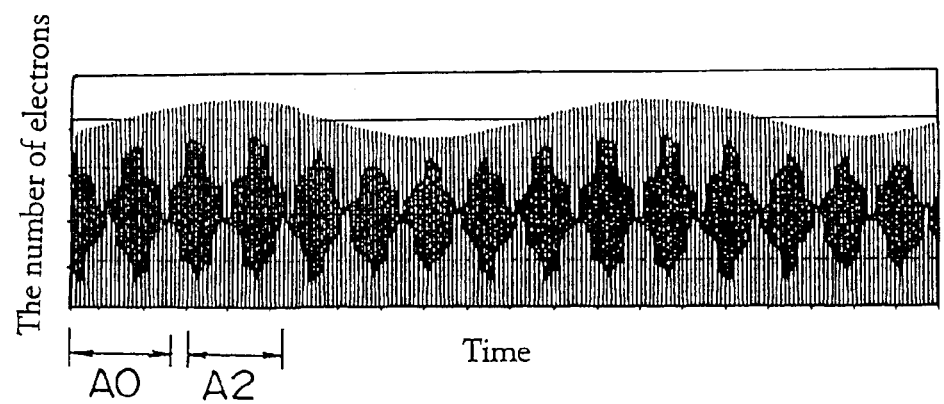
FIGS. 28A and 28B are explanatory diagram illustrating the principle of operation of the distance measuring device.
Figure 28B:
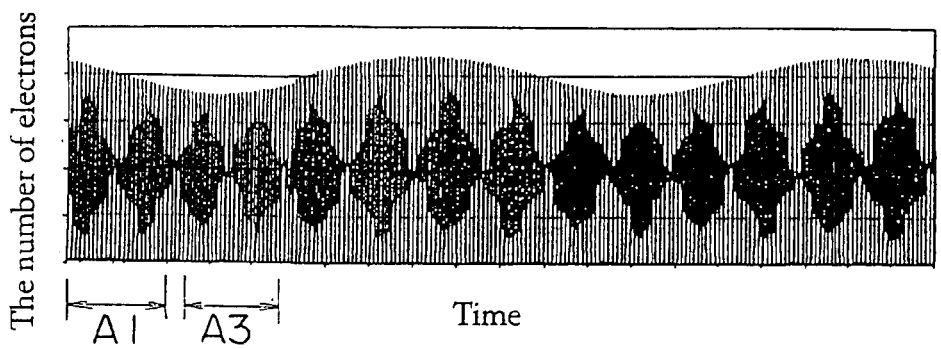

A ratio of amounts of signal charges migrated to the potential well of an electric charge storage relative to the amounts of electric charges generated by the photodiode 21 can be adjusted by giving a local oscillator signal to each of the overflow drains 61a, 61b. In this embodiment, local oscillator signals "φ1", "φ2" are given to adjacent overflow drains 61a, 61b in the direction of transferring the signal charges at the same frequency but in opposite phase. By use of the local oscillator signals "φ1", "φ2" having the same frequency but in the opposite phase, beat signals respectively corresponding to the local oscillator signals are also in opposite phase, as shown in FIGS. 28A and 28B.

That is, when the above-described control is performed under a condition that one pixel is provided by a set of adjacent two photodiodes 21, electric charges corresponding to each of the beat signals in the opposite phase are stored in the electric charge storage corresponding to each of the two photodiodes 21. By performing integration with respect to each of these beat signals in opposite phase, it is possible to simultaneously obtain two of the four integrals A0~A3 required to determine the phase difference "ψ". That is, in this embodiment, both of the integrals A0, A1 can be simultaneously stored, and both of the integrals A2, A4 can be simultaneously stored.

In this embodiment, since the signal charges are mixed with extraneous electric charges with an intended purpose, they become noise components. However, amounts of the extraneous electric charges are much smaller than the signal charges, and the extraneous electric charges are mixed at a substantially constant ratio with the signal charges. Therefore, the noise components have a minimal influence on determining the phase difference "ψ". Other configuration and performance are similar to the seventh embodiment.

(Twelfth Embodiment)

Figure 29:
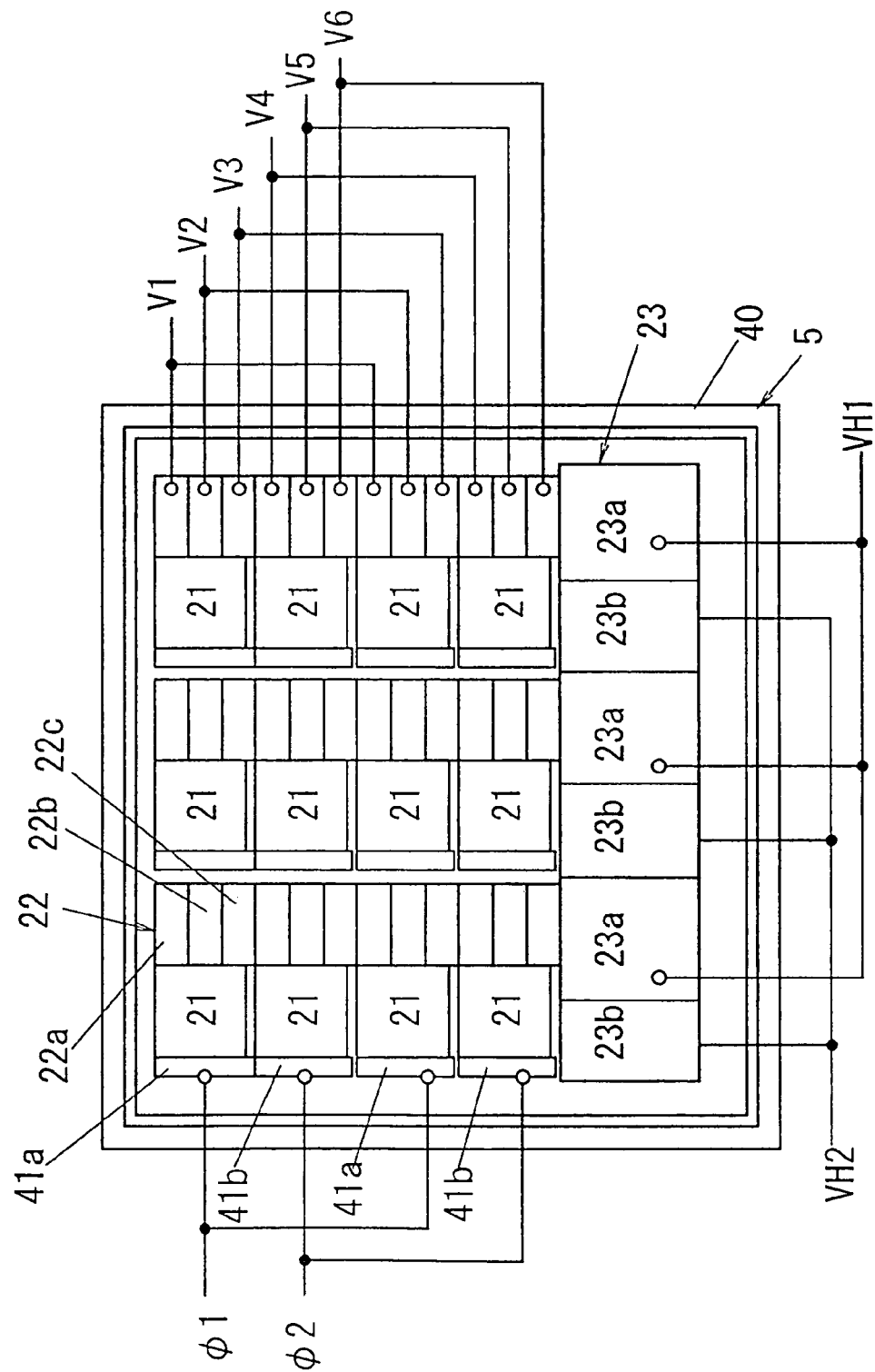
FIG. 29 is a plan view of an image sensor for a distance measuring device according to a twelfth embodiment of the invention.

In the eleventh embodiment, a modification of the interline transfer CCD having the lateral overflow drain may be used as the image sensor 5 in place of the modification of the frame transfer CCD. That is, as shown in FIG. 29, overflow drains (41a, 41b) are alternately disposed adjacent to the photodiodes 21 aligned in the vertical direction such that each of the overflow drains is provided every photodiode 21. In addition, three gate electrodes 22a~22c are formed every photodiode 21 in a vertical transfer portion 22.

In this image sensor 5, one pixel is provided by a pair of adjacent photodiodes 21 in the vertical direction, and local oscillator signals "φ1", "φ2" are given to overflow drains 41a, 41b corresponding to the two photodiodes 21 defining the pixel at the same frequency but in opposite phase. In addition, as in the case of the eleventh embodiment, the gate electrodes 21a~21c are driven by a 6-phase clock. As a result, it is possible to simultaneously determine two of the integrals A0~A3. Other configuration and performance are similar to the eleventh embodiment.

In the eleventh and twelfth embodiments, three gate electrodes are formed every overflow drain. However, the number of gate electrodes formed every overflow drain may be four or more. In addition, when four local oscillator signals having phases which are different from each other by 90 degrees are given to different overflow drains in place of the local oscillator signals "φ1", "φ2" in opposite phase, it is possible to simultaneously determine the integrals A0~A3.

Moreover, the local oscillator signals "φ1", "φ2" in opposite phase may be given to the gate electrodes 21a~21c, 22a~22c. Alternatively, the local oscillator signals "φ1", "φ2" in opposite phase may be given to both of the overflow drain and those gate electrodes.

Figure 30:
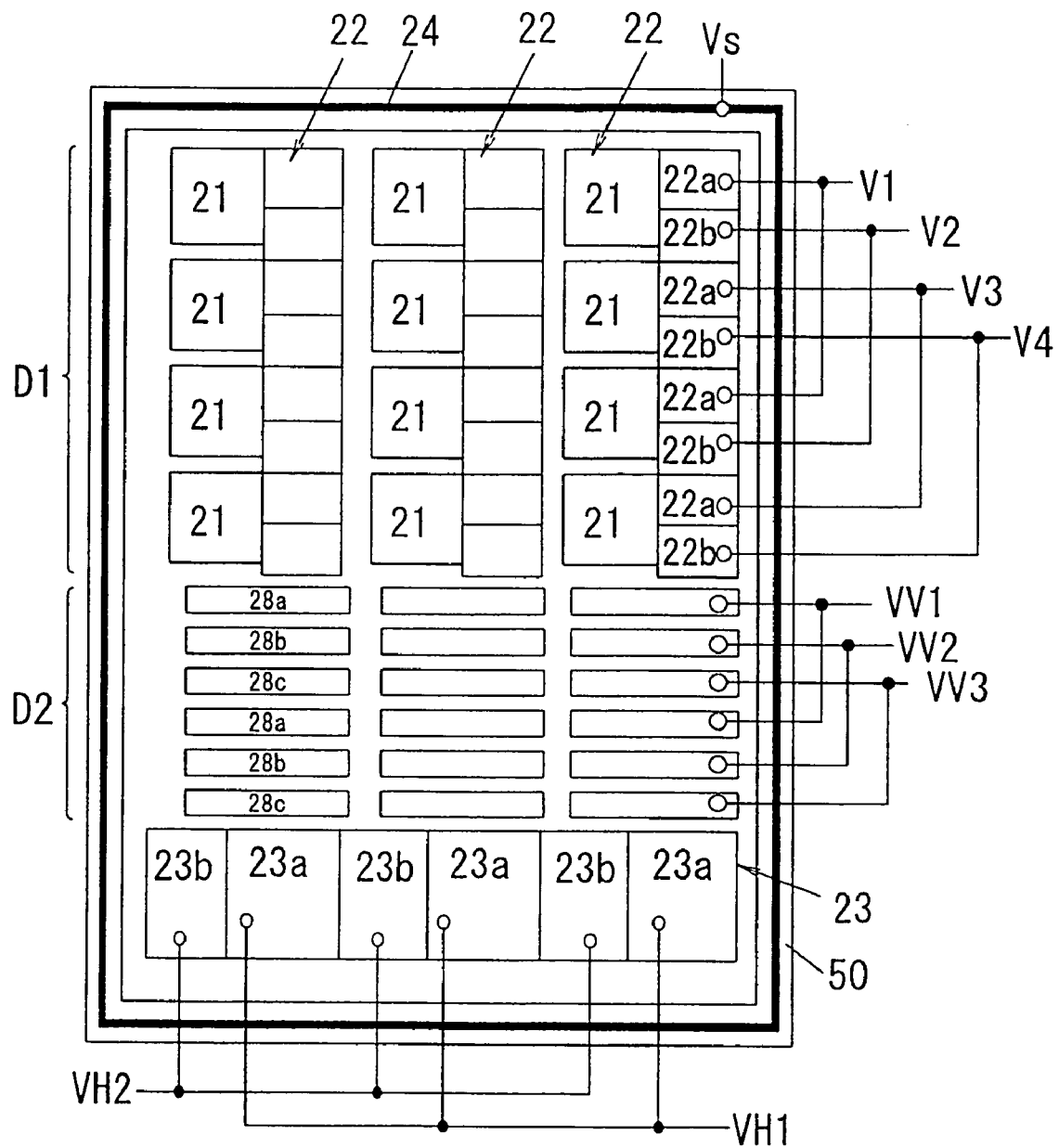
FIG. 30 is a plan view of an image sensor for the distance measuring device according to a modification of the sixth embodiment.
Figure 31:
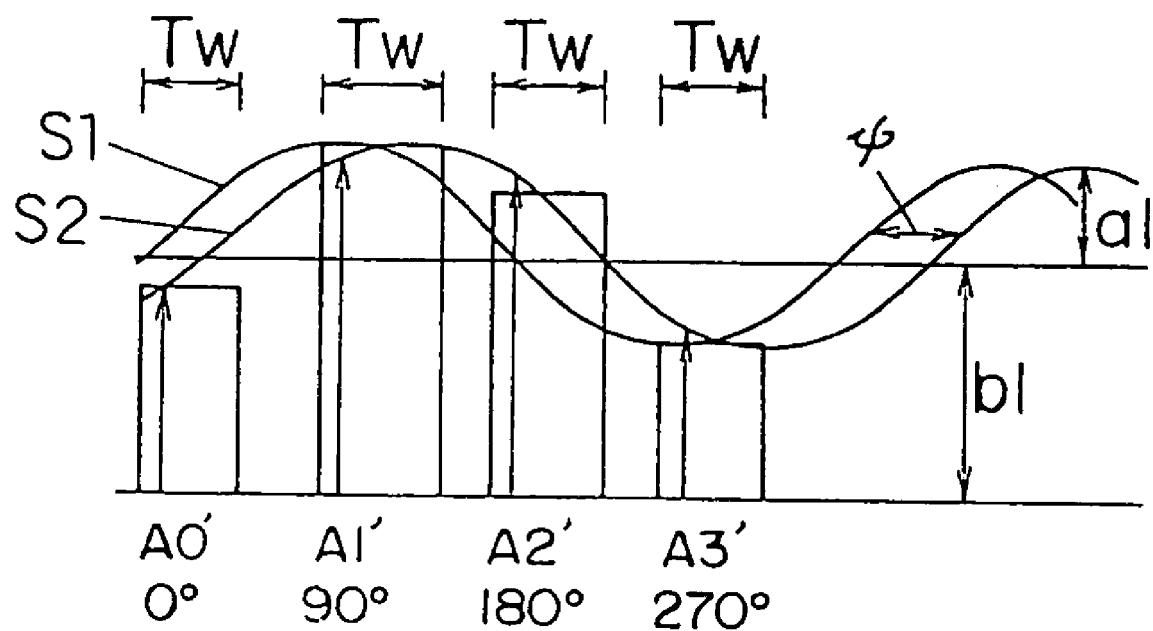
FIG. 31 is an explanatory diagram illustrating the principle of operation of a conventional distance measuring device.

In the above embodiments, the interline transfer CCD or the frame transfer CCD are used as the image sensor 5. In addition, as shown in FIG. 30, it is possible to use a frame interline transfer CCD, which is obtained by replacing the image pickup portion "D1" of the frame transfer CCD of FIG. 15 with the photodiodes 21 and the vertical transfer portions 22 of the interline transfer CCD. In this case, there is an advantage that the occurrence of smear can be prevented, as compared with the frame transfer CCD.

In the above-explained embodiments, a 1-dimensional image sensor may be used in place of the 2-dimensional image sensor. In addition, only one photoelectric converter 3 may be used in the first embodiment. In addition, the analyzer for determining the distance information is used in the above embodiments. However, as the information about the intended space, only the phase difference "ψ" may be determined by the analyzer. Alternatively, another information about the intended space are evaluated or determined by the analyzer according to the integrals A0~A3.

INDUSTRIAL APPLICABILITY

As described above, according to the spatial information detecting device of the present invention, even when a distortion of the waveform of the light received by the photoelectric converter occurs due to a distortion of the signal waveform for driving the light source or a temporal change in the amount of light incoming from outside into the space, there is little influence on measuring accuracy because the integration of the beat signal is used to determine the spatial information. Therefore, there is an advantage that the spatial information can be detected with improved accuracy, as compared with conventional detecting devices that the measuring accuracy is influenced by the waveform. In addition, since the spatial information is determined by use of the integration of the beat signal having a lower frequency than the emission frequency of the intensity-modulated light, there is another advantage that a relatively cheap switching device is available at the light receiving side in place of an expensive switching device having high-speed response.

The spatial information detecting device having these advantages of the present invention is widely available to any devices required to determine the phase difference between the intensity-modulated light and the received light, and particularly suitable to the distance measuring device.

The invention claimed is:

1. A spatial information detecting device using intensity-modulated light comprising:
   at least one photoelectric converter for receiving a light provided from a space into which a light intensity-modulated at a predetermined emission frequency is being irradiated, and generating an electrical output corresponding to an intensity of received light;
   a local oscillator circuit for outputting a local oscillator signal having a local oscillator frequency different from the emission frequency;
   a sensitivity controller for mixing said local oscillator signal with said electrical output to frequency convert said electrical output into a beat signal having a lower frequency than the emission frequency;

an integrator for performing integration of said beat signal at a predetermined timing; and an analyzer for determining information about said space according to an output of said integrator.

2. The spatial information detecting device as set forth in claim 1, wherein said integrator performs the integration of said beat signal with respect to a plurality of integration ranges, each of which is determined within a given phase interval of said beat signal, and said analyzer includes determining a phase difference between the light irradiated into the space and the light received by said photoelectric converter from resultant integrals of the plurality of integration ranges.

3. The spatial information detecting device as set forth in claim 1, wherein said sensitivity controller comprises a semiconductor switch provided between said photoelectric converter and said integrator.

4. The spatial information detecting device as set forth in claim 1, wherein said photoelectric converter generates, as said electrical output, amounts of electric charges corresponding to the intensity of received light, said integrator is provided with a charge storage for storing, as signal charges, at least part of electric charges generated by said photoelectric converter, and a charge ejector for ejecting the electric charges from said charge storage in synchronization with said beat signal having a frequency difference between the emission frequency and the local oscillator frequency, and said sensitivity controller has a function of modulating, at the local oscillator frequency, a ratio of amounts of electric charges migrating to said charge storage relative to the amounts of electric charges generated by said photoelectric converter.

5. The spatial information detecting device as set forth in claim 4, wherein said charge storage stores the signal charges of a plurality of ranges, each of which is determined within a given phase interval of said beat signal, and said analyzer includes determining a phase difference between the light irradiated into the space and the light received by said photoelectric converter from the stored signal charges of the plurality of ranges.

6. The spatial information detecting device as set forth in claim 4, wherein said sensitivity controller comprises a storage gate provided between said photoelectric converter and said charge storage to adjust amounts of electric charges migrating from said photoelectric converter to said charge storage.

7. The spatial information detecting device as set forth in claim 4, wherein said sensitivity controller includes a charge discarding means for removing, as unnecessary charges, at least part of the electric charges generated by said photoelectric converter.

8. The spatial information detecting device as set forth in claim 4, wherein said sensitivity controller comprises a storage gate provided between said photoelectric converter and said charge storage to adjust amounts of electric charges migrating from said photoelectric converter to said charge storage, and a charge discarding means for removing, as unnecessary charges, at least part of the electric charges generated by said photoelectric converter.

9. The spatial information detecting device as set forth in claim 4, wherein said at least one photoelectric converter are a plurality of photoelectric converters, said charge storage of said integrator is a CCD (charge-coupled device) having a region of storing, as signal charges, at least part of electric charges generated by each of said photoelectric converters at a region corresponding to a gate electrode provided every photoelectric converter, said charge ejector is a CCD for transferring the signal charges from said charge storage to outside, said charge discarding means is formed with an overflow drain for discarding at least part of electric charges generated by each of said photoelectric converters in a batch manner according to an external signal, said photoelectric converters, said charge storage, said charge ejector, and said charge discarding means are mounted on a single semiconductor substrate to obtain an image sensor, and said sensitivity controller is at least one of said gate electrode and said charge discarding means.

10. The spatial information detecting device as set forth in claim 4, wherein said at least one photoelectric converter are a plurality of photoelectric converters, and said photoelectric converters, said charge storage, said charge ejector, and said charge discarding means are mounted on a single semiconductor substrate so as to provide, as a whole, an interline transfer CCD image sensor having an overflow drain.

11. The spatial information detecting device as set forth in claim 4, wherein said at least one photoelectric converter are a plurality of photoelectric converters, and said photoelectric converters, said charge storage, said charge ejector, and said charge discarding means are mounted on a single semiconductor substrate so as to provide, as a whole, a frame transfer CCD image sensor having an overflow drain.

12. The spatial information detecting device as set forth in claim 9, wherein said image sensor has a light shielding film on regions of storing electric charges and not relating to the generation of electric charges.

13. The spatial information detecting device as set forth in claim 9, wherein said sensitivity controller is said gate electrode, and a voltage applied to said gate electrode is modulated by the local oscillator frequency.

14. The spatial information detecting device as set forth in claim 9, wherein said sensitivity controller is said charge discarding means, and an external signal to be given to said charge discarding means is modulated by the local oscillator frequency.

15. The spatial information detecting device as set forth in claim 9, wherein said sensitivity controller is both of said gate electrode and said charge discarding means, and each of a voltage applied to said gate electrode and an external signal to be given to said charge discarding means is modulated by the local oscillator frequency.

16. The spatial information detecting device as set forth in claim 4, wherein said at least one photoelectric converter are a plurality of photoelectric converters, a set of photoelectric converters is selected from the plurality of photoelectric converters to define one pixel, a plurality of sensitivity controllers corresponding to said photoelectric converters of the set are modulated by local oscillator signals having a same local oscillator frequency and different phases from each other, and said charge ejector simultaneously outputs the signal charges corresponding to the different phases of said beat signal obtained by said photoelectric converters of the set.

17. The spatial information detecting device as set forth in claim 16, wherein said analyzer includes determining a phase difference between the light irradiated into the space and the light received by said photoelectric converter from the signal charges corresponding to the different phases of said beat signal.

18. The spatial information detecting device as set forth in claim 16, wherein said at least one photoelectric converter are a plurality of photoelectric converters, said charge storage of said integrator is a CCD (charge-coupled device) having a region of storing at least part of electric charges generated by each of said photoelectric converters at a region corresponding to a gate electrode provided every photoelectric converter, said charge ejector is a CCD for transferring the electric charges from said charge storage to outside, said charge discarding means is formed with an overflow drain for discarding at least part of electric charges generated by each of said photoelectric converters in a batch manner according to an external signal, said photoelectric converters, said charge storage, said charge ejector, and said charge discarding means are mounted on a single semiconductor substrate to obtain an image sensor, and said sensitivity controller is at least one of said gate electrode and said charge discarding means.

19. The spatial information detecting device as set forth in claim 2, wherein said analyzer includes converting said phase difference into distance information.

* * * * *